United States Patent
Saitoh et al.

(10) Patent No.: US 7,465,407 B2
(45) Date of Patent: Dec. 16, 2008

(54) PLASMA PROCESSING METHOD AND APPARATUS

(75) Inventors: Mitsuo Saitoh, Neyagawa (JP);
Tomohiro Okumura, Kadoma (JP);
Ichiro Nakayama, Kadoma (JP)

(73) Assignee: Panasonic Corporation, Osaka (JP)

( * ) Notice: Subject to any disclaimer, the term of this patent is extended or adjusted under 35 U.S.C. 154(b) by 1 day.

(21) Appl. No.: 10/649,670

(22) Filed: Aug. 28, 2003

(65) Prior Publication Data

US 2004/0129220 A1    Jul. 8, 2004

(30) Foreign Application Priority Data

Aug. 28, 2002   (JP)   .............................. 2002-248245

(51) Int. Cl.
*C23C 16/00*   (2006.01)
(52) U.S. Cl. ....................................... 216/71
(58) Field of Classification Search ........................ None
See application file for complete search history.

(56) References Cited

U.S. PATENT DOCUMENTS

| | | | | |
|---|---|---|---|---|
| 5,102,523 A | * | 4/1992 | Beisswenger et al. | 204/298.33 |
| 5,315,473 A | * | 5/1994 | Collins et al. | 361/234 |
| 5,400,209 A | * | 3/1995 | Moslehi | 361/234 |
| 6,248,219 B1 | * | 6/2001 | Wellerdieck et al. | 204/192.12 |
| 6,497,839 B1 | * | 12/2002 | Hasegawa et al. | 422/22 |
| 2003/0091742 A1 | * | 5/2003 | Forget et al. | 427/255.28 |
| 2003/0170472 A1 | * | 9/2003 | Fukuda et al. | 428/469 |

FOREIGN PATENT DOCUMENTS

| | | |
|---|---|---|
| JP | 7-86238 | 3/1995 |
| JP | 2001-102199 | 4/2001 |
| JP | 2003-59841 | 2/2003 |
| JP | 2003-59909 | 2/2003 |

* cited by examiner

*Primary Examiner*—Allan Olsen
(74) *Attorney, Agent, or Firm*—Wenderoth, Lind & Ponack, L.L.P.

(57) ABSTRACT

In a plasma processing method for supplying an electric power to a first electrode, making a first electrode have a ground potential, or making a first electrode have a floating potential while supplying gas to a plasma source arranged in a vicinity of an object to be processed at a pressure in a vicinity of an atmospheric pressure. The method includes processing a part of the object to be processed with a plasma in a state where an area of a surface of a potentially controlled second electrode, arranged in a position opposite to the plasma source via the object to be processed, is made superposed on the object to be processed smaller than an area of a surface of the plasma source superposed on the object to be processed.

16 Claims, 22 Drawing Sheets

PLASMA PROCESSING METHOD AND APPARATUS

BACKGROUND OF THE INVENTION

The present invention relates to plasma processing method and apparatus for performing, with plasma, surface treatment such as patterning a thin film formed on a surface of an object to be processed represented by a substrate.

In general, when an object to be processed represented by a substrate on the surface of which a thin film is formed is subjected to a patterning process, a resist process is used. FIGS. 33A, 33B, 33C and 33D show one example of the process. In FIGS. 33A, 33B, 33C and 33D, first of all, a photosensitive resist 119 is coated on the surface of an object 106 to be processed (FIG. 33A). Next, if the resist 119 is exposed to light by an exposure apparatus and thereafter developed, then the resist 119 can be patterned into the desired configuration (FIG. 33B) Then, if the object 106 to be processed is placed in a vacuum vessel, a plasma is generated in the vacuum vessel and the object 106 to be processed is subjected to an etching process with the resist 119 used as a mask, then the surface of the object 106 to be processed is patterned into the desired configuration (FIG. 33C). Finally, by removing the resist 119 with an oxygen plasma, organic solvent, or the like, the processing is completed (FIG. 33D)

The above-mentioned resist process, which has been suitable for accurately forming a fine pattern, has come to play an important role in manufacturing electronic devices such as semiconductors. However, there is a defect that the process is complicated.

Accordingly, there is examined a new plasma processing method that uses no resist process. As a first prior art example, a plasma source that linearly generates a plasma will be described with reference to FIGS. 34 and 35. FIG. 34 shows a perspective view of a plasma processing apparatus that has a plasma source equipped with a knife-edge electrode section 109, and FIG. 35 shows a sectional view taken along the plane PP of FIG. 34. In FIGS. 34 and 35, insulating plates 110 and 111 are arranged in positions where the knife-edge electrode section 109 and the plate surfaces become mutually parallel, and gas can be supplied almost perpendicularly to an object 106 to be processed from a gas supply unit 105 via a gas passage 112. By applying a high-frequency power of 13.56 MHz to the knife-edge electrode section 109 from a high-frequency power source 108 while supplying gas from the gas supply unit 105, a plasma is generated between the plasma source including the knife-edge electrode section 109 and the object 106 to be processed, and the object 106 to be processed can be processed with the plasma. A distance b between the plasma source and the object 106 to be processed is 0.5 mm, and a width c of each of the knife-edge electrode section 109 and the insulating plates 110 and 111 is 1 mm. A width d of the gas passage 112 is 0.1 mm, and an acute angle of an edge portion e of the knife-edge electrode section is 60°. The plate surfaces of the knife-edge electrode section 109 and the plate surfaces of the plates 110 and 111 have a height f of 50 mm and a length g of 30 mm in the line direction.

Since the plasma source shown in FIGS. 34 and 35 is movable with respect to the X-, Y- and Z-axes, the object 106 to be processed can be linearly processed with the plasma over a wide range.

For example, under the conditions that He is supplied by 1000 sccm and $SF_6$ is supplied by 10 sccm as gas to the gas passage 112 and a high-frequency power of 100 W is supplied, quartz as the object 106 to be processed can be processed with a plasma.

Next, as a second prior art example, a plasma source that generates a plasma in a hole-like shape will be described with reference to FIGS. 36 and FIG. 37. FIG. 36 shows a perspective view of a plasma processing apparatus that has a plasma source equipped with a cylindrical electrode 120, and FIG. 37 shows a sectional view taken along the plane PP of FIG. 36. Referring to FIGS. 36 and 37, the cylindrical electrode 120 is arranged in a position concentric with a cylindrical insulator 121, and gas can be supplied from a gas supply unit 105 almost perpendicularly to an object 106 to be processed via a gas passage 122 inside the cylindrical insulator 121. By applying a high-frequency power of 13.56 MHz to the cylindrical electrode 120 from a high-frequency power source 108 while supplying gas from the gas supply unit 105, a plasma is generated between the plasma source including the cylindrical electrode 120 and the object 106 to be processed, and, for example, quartz as the object 106 to be processed can be processed with the plasma. A distance b between the plasma source and the object 106 to be processed is 0.5 mm, the cylindrical electrode 120 has an outside diameter of 1 mm, and the cylindrical insulator 121 has an inside diameter of 3 mm.

Since the plasma source shown in FIGS. 36 and 37 is movable with respect to the X-, Y- and Z-axes, the object 106 to be processed can be processed with the plasma in a hole-like shape over a wide range.

For example, under the conditions that He is supplied by 1000 sccm and $SF_6$ is supplied by 10 sccm as gas to the gas passage 122 and a high-frequency power of 100 W is supplied, the object 106 to be processed can be processed by the plasma.

Next, FIGS. 38 and 39 show a plasma processing method and apparatus as a third prior art example. FIG. 38 shows an example of a processing configuration including line processing and hole processing effected on the object 106 to be processed. In the figures, "h" represents a hole shape of a diameter of 1 mm, "i" represents a linear shape of a length (X-direction) of 40 mm and a width (Y-direction) of 1 mm, and "j" represents a linear shape of a length (Y-direction) of 30 mm and a width (X-direction) of 100 μm. FIG. 39 shows a plasma processing method and apparatus for etching a quartz substrate into a processing configuration as shown in FIG. 38. The quartz substrate was processed with a plasma in the order of (A) of FIG. 39→(B) of FIG. 39 →(C) of FIG. 39 under the aforementioned plasma conditions using the plasma sources of FIGS. 34 and 35 and FIGS. 36 and 37. In the case (A) of FIG. 39, the hole-like shape and the linear shape were concurrently processed with a plasma by means of the plasma source of FIG. 36 and the plasma source of FIG. 34, respectively. After plasma processing for about 105 sec, the plasma sources were scanned in the −X-direction to successively carry out the plasma processing. In the case (B) of FIG. 39, the linear shape was processed with a plasma by means of the plasma source of FIG. 34. Since the processing size is larger than the size of the plasma source, the plasma source was scanned in two directions of −X-direction and Y-direction. After the plasma processing (B) of FIG. 39, a processed configuration as shown in (C) of FIG. 39 was able to be formed.

However, the processing by the plasma processing methods and apparatuses described in connection with the prior art examples have had an issue that the processing size processable at a time has been disadvantageously determined upon determining the shape of the plasma source and an increasing number of plasma sources equipped with a gas supply unit and a high-frequency power supply unit have been needed as the processing configuration has become more complicated.

In view of the aforementioned conventional issues, the present invention has an object to provide a plasma processing method and apparatus capable of processing with plasma the desired arbitrary configuration (processing an object to be processed with plasma in the desired arbitrary configuration (configuration to be processed)) by a simple plasma source.

SUMMARY OF THE INVENTION

In accomplishing these and other aspects, according to a first aspect of the present invention, there is provided a plasma processing method for supplying an electric power to a first electrode, making a first electrode have a ground potential, or making a first electrode have a floating potential while supplying gas to a plasma source arranged in a vicinity of an object to be processed at a pressure in a vicinity of an atmospheric pressure, the method comprising processing a part of the object to be processed with a plasma, while supplying an electric power to at least one of the first electrode and the second electrode, in a state where an area of a surface of a potentially controlled second electrode arranged in a position opposite to the plasma source via the object to be processed is made superposed on the object to be processed smaller than an area of a surface of the plasma source superposed on the object to be processed.

According to a second aspect of the present invention, there is provided the plasma processing method as claimed in the first aspect, wherein the second electrode is constructed of a plurality of electrodes, and the object to be processed is processed with a plasma into a configuration to be processed by selectively potentially controlling the respective microelectrodes.

According to a third aspect of the present invention, there is provided the plasma processing method as claimed in the first aspect, wherein the second electrode is constructed by arranging a plurality of potentially controlled electrodes, and the object to be processed is processed with a plasma into configuration to be processed by selectively bringing arbitrary microelectrodes close to the object to be processed.

According to a fourth aspect of the present invention, there is provided the plasma processing method as claimed in the first aspect, wherein the object to be processed has a substrate or a thin film of a volume resistivity of not smaller than $10^{-6}$ ($\Omega \cdot cm$).

According to a fifth aspect of the present invention, there is provided the plasma processing method as claimed in the first aspect, wherein the object to be processed has a substrate or a thin film of a volume resistivity of not smaller than $10^{-8}$ ($\Omega \cdot cm$).

According to a sixth aspect of the present invention, there is provided the plasma processing method as claimed in the first aspect, wherein positions of the plasma source and the potentially controlled second electrode are displaced relatively to the object to be processed.

According to a seventh aspect of the present invention, there is provided the plasma processing method as claimed in the first aspect, wherein the gas includes at least any one of inert gases of He, Ar, Ne, and Xe.

According to an eighth aspect of the present invention, there is provided the plasma processing method as claimed in the first aspect, wherein the gas includes a gas of CxFy (x and y are natural numbers) such as $SF_6$, and $CF_4$, $NF_3$, $O_2$, $Cl_2$, or a halogen containing gas of HBr or the like as reactive etching gas.

According to a ninth aspect of the present invention, there is provided a plasma processing apparatus comprising:

a plasma source provided with a potentially controllable or floating potential first electrode arranged in a processing chamber;

a gas supply unit;

a power supply unit for supplying an electric power to the first electrode;

a potentially controllable second electrode in a position opposite to a plasma source via a position where an object to be processed is to be arranged in the chamber; and an electric power supplying device for supplying an electric power to at least one of the first electrode and the second electrode, wherein an area of a surface of the second electrode superposed on the object to be processed is made smaller than an area of a surface of the plasma source superposed on the object to be processed.

According to a tenth aspect of the present invention, there is provided the plasma processing apparatus as claimed in the ninth aspect, wherein the potentially controllable second electrode comprises an electrode unit of a plurality of electrodes and capable of selectively potentially controlling the respective electrodes.

According to an 11th aspect of the present invention, there is provided the plasma processing apparatus as claimed in the ninth aspect, wherein the potentially controllable second electrode comprises an electrode unit of a plurality of potentially controlled electrodes and capable of selectively bringing electrodes close to the object to be processed.

According to a 12th aspect of the present invention, there is provided the plasma processing apparatus as claimed in the ninth aspect, further comprising a moving device capable of displacing positions of the plasma source and the potentially controllable second electrode relatively to each other.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
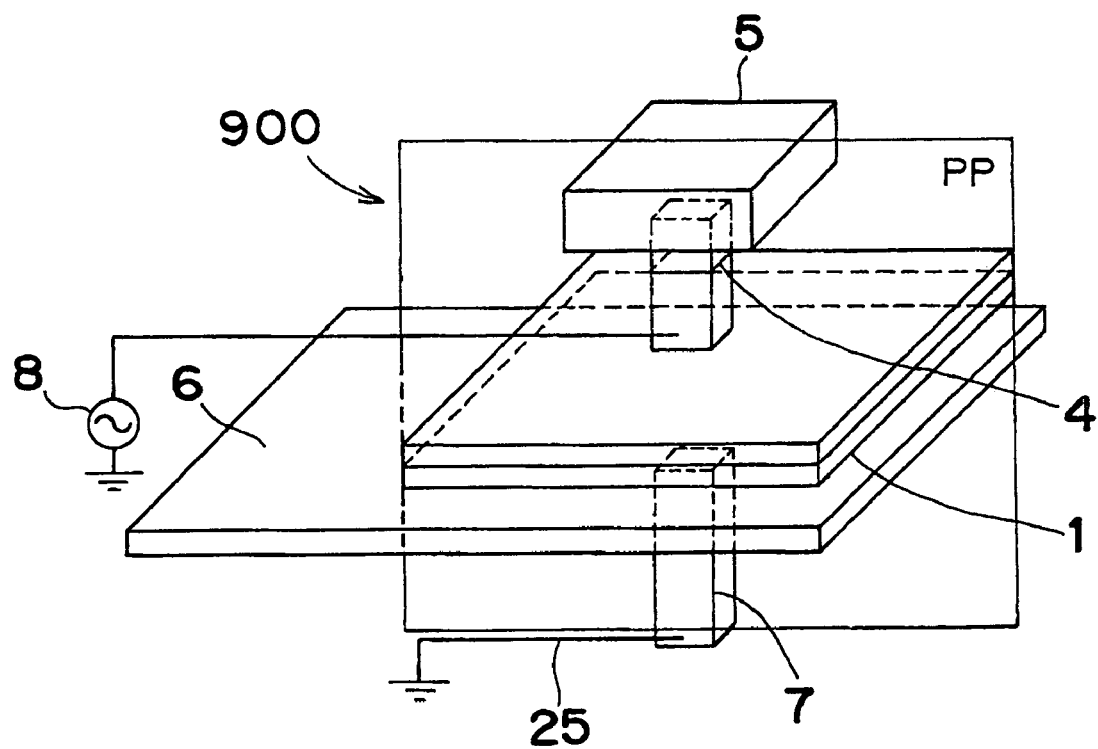
FIG. 1 is a perspective view showing the construction of a plasma processing apparatus employed in a first embodiment of the present invention.

Before the description of the present invention proceeds, it is to be noted that like parts are designated by like reference numerals throughout the accompanying drawings.

The first embodiment of the present invention will be described below with reference to FIGS. 1 through 5.

Figure 2:
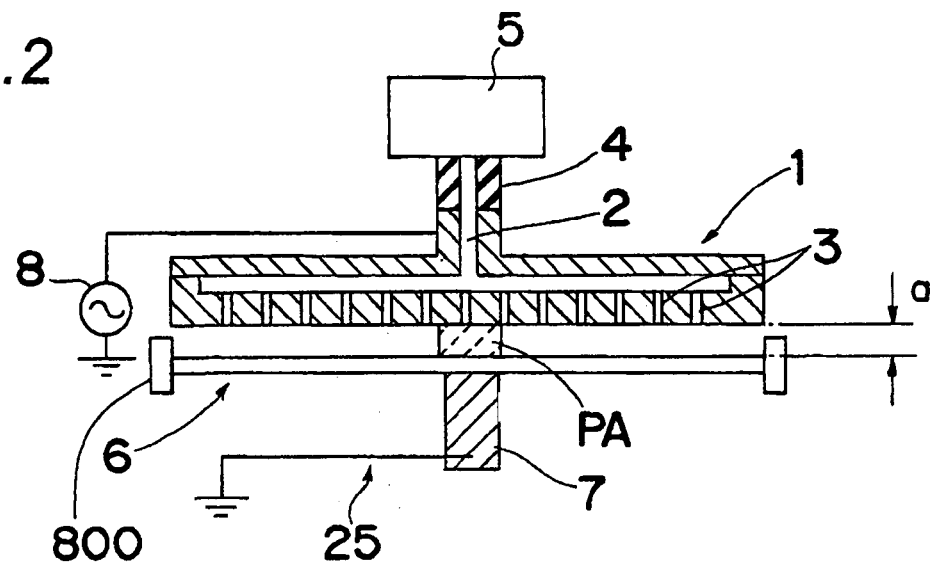
FIG. 2 is a sectional view showing the construction of the plasma processing apparatus employed in the first embodiment of the present invention.

FIG. 1 shows a perspective view of a plasma processing apparatus including a plasma source 900 equipped with a flat electrode section 1 employed in the first embodiment of the present invention. FIG. 2 shows a sectional view taken along the plane PP of FIG. 1. Referring to FIGS. 1 and 2, a gas passage 2 and gas supply holes 3 are formed in the flat electrode section 1, and gas can be supplied almost perpendicularly to an object 6 to be processed (for example, a substrate of Si or quartz or the like)(which is supported by an object supporting device 800 constructed of chucks or known holding mechanisms etc. (the object 6 is supported by such device in a similar manner in other embodiments.)) via the gas supply unit 2 and the gas supply holes 3 from a gas supply unit 5 electrically insulated from the flat electrode section 1 by an insulator 4. A grounding electrode 7 is arranged as an electrode potentially controlled via wiring 25 in a position opposite to the plasma source with interposition of the object 6 to be processed. By supplying a high-frequency power of 13.56

MHz to the flat electrode section 1 from a high-frequency power source 8, serving as one example of an electric power supplying device, while supplying the gas from the gas supply unit 5, a plasma can be generated in a local plasma space PA, and thus, the object 6 to be processed can be processed with the plasma. A distance "a" between the plasma source and the object 6 to be processed is 0.5 mm. A surface of the flat electrode section 1 opposite to the object 6 to be processed has a square shape of a side length of 50 mm, and a surface of the grounding electrode 7 opposite to the object 6 to be processed has a square shape of a side length of 5 mm. The area of the surface of the potentially controlled second electrode (grounding electrode 7) superposed on the object 6 to be processed is smaller than the area of the object 6 to be processed. In the case where the area of the surface of the potentially controlled second electrode superposed on the object to be processed is smaller than the area of the object to be processed, this embodiment produces remarkable effects. The above is because it becomes impossible to control the range in which a plasma is generated by the arrangement of the second electrode when the area of the surface of the potentially controlled second electrode superposed on the object to be processed is not smaller than the area of the object to be processed.

Here, the object to be processed has a substrate or a thin film having the volume resistivity of not smaller than $10^{-6}$ (Ω·cm) so as to plasma-process the substrate or thin film. If the volume resistivity is smaller than $10^{-6}$ (Ω·cm), then the range in which a plasma is generated is disadvantageously determined depending on the arrangement of the first electrode: regardless of the state of the potentially controlled second electrode. Particularly, if the volume resistivity is not smaller than $10^8$ (Ω·cm), then the range in which a plasma is generated can reliably be accurately controlled by the arrangement of the potentially controlled second electrode.

The plasma source, which is operable from several pascals to several atmospheres, operates typically within a range of 10000 Pa to about three atmospheres. In particular, the operation in the vicinity of the atmospheric pressure is especially preferable since neither strict sealed structure nor special exhaust unit is needed and the diffusion of plasma and activated particles is moderately restrained. Under the conditions of He supplied by 1000 sccm, $SF_6$ supplied by 10 sccm as gas and a high-frequency power of 100 W supplied, quartz as the object 6 to be processed was etched as plasma processing. Consequently, a plasma was generated only in a local plasma space PA, and thus, etching was able to be effected on the desired pattern. At this time, the plasma space PA had an approximately 5-mm square cross section parallel to the object 6 to be processed.

Figure 40:
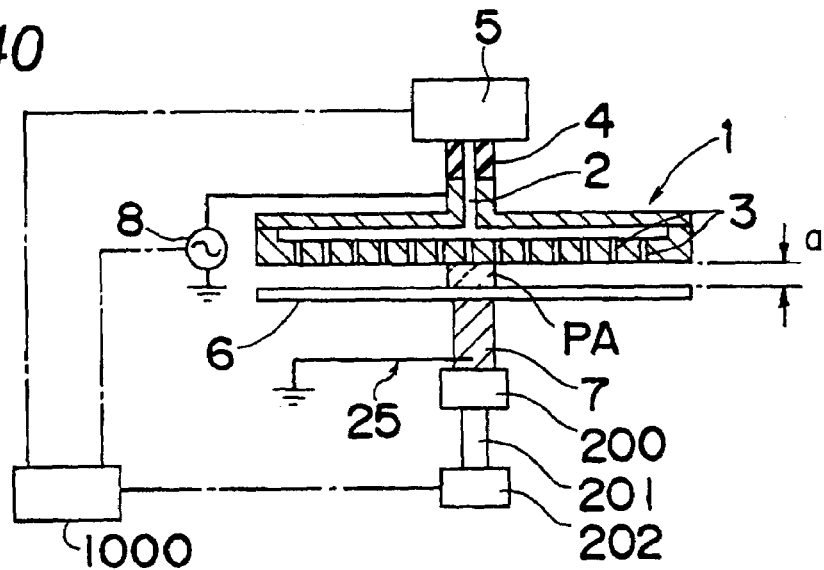
FIG. 40 is a sectional view showing a plasma processing apparatus with a moving device in a first modification of the first embodiment of the present invention.

In the plasma processing apparatus, as shown in FIG. 40, there can be provided with a moving device for moving the grounding electrode 7 away from the object 6 to be processed. That is, such a moving device includes: an insulating member 200 connected to the grounding electrode 7; a column 201 connected to the insulating member 200; and an elevating device 202 such as air cylinder, connected to the column 201, for capable of moving up and down the insulating member 200 together with the grounding electrode 7 by moving up and down the column 201. By a controller 1000 for controlling operations of the gas supply unit 5 and the high-frequency power source B, the elevating operation of the elevating device 202 can be controlled. Thus, when under the control of the controller 1000, the grounding electrode 7 is moved away from and moved close to the object 6 to be processed by the elevating device 202 while the high-frequency power source 8 is turned on, the similar effects to the case where the high-frequency power source 8 is turned on and off can be obtained. Under the control of the controller 1000, the high-frequency power source 8 is turned off or the grounding electrode 7 is moved away from the object 6 to be processed by the elevating device 202, and thereafter, as shown in FIGS. 3 and 41 described below, the grounding electrode 7 is moved and positioned to a desired position of the object 6 to be processed, discontinuous pattern can be drawn on the object 6 to be processed.

Figure 3:
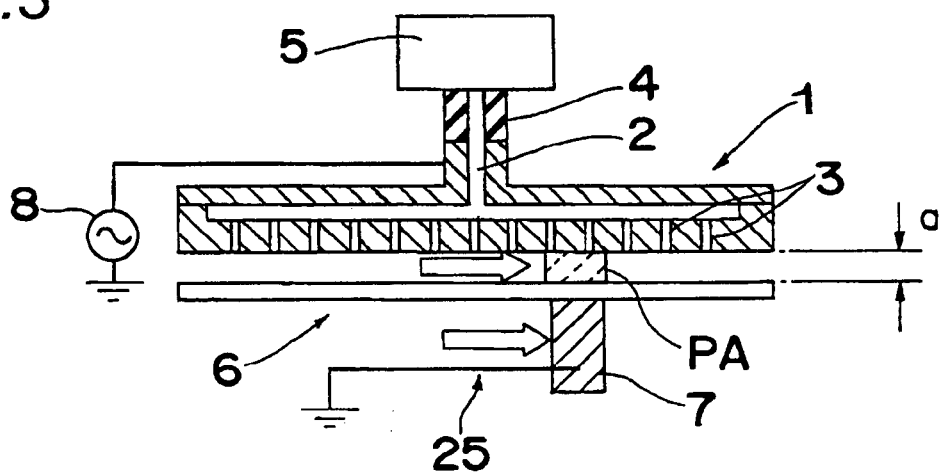
FIG. 3 is a sectional view showing the construction of the plasma processing apparatus employed in the first embodiment of the present invention.

In the first embodiment of the present invention, by displacing the grounding electrode 7 parallel to the object 6 to be processed during plasma processing as shown in FIG. 3, the plasma generated in the local plasma space PA was displaced following the grounding electrode 7 in parallel, and etching was able to be effected on the desired pattern.

Figure 41:
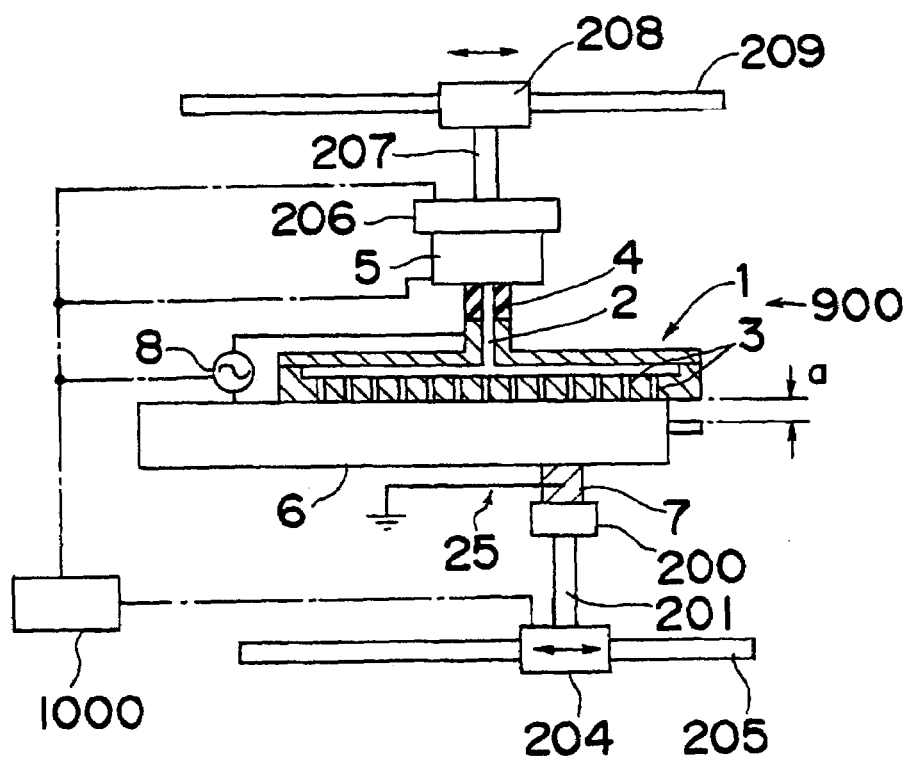
FIG. 41 is a sectional view showing a plasma processing apparatus with a moving device in a second modification of the first embodiment of the present invention.

FIG. 41 shows a moving device for moving the grounding electrode 7 of FIG. 3 in parallel with the object 6 to be processed. In FIG. 41, reference numeral 204 denotes a lower side-moving device having the function of the elevating device 202 and having a linear slider mechanism for moving the grounding electrode 7 in parallel with the object 6 to be processed, and 205 denotes a rail for guiding the movement of the lower side-moving device 204. Reference numeral 206 denotes an insulating member connected to the gas supply unit 5, 207 denotes a column connected to the insulating member 206, 208 denotes an upper side-moving device connected to the column 207, having the function of the elevating device such as an air cylinder for moving up and down the insulating member 206 together with a plasma source 900 including the gas supply unit 5 etc. by moving up and down the column 207, and having a linear slider mechanism for moving the plasma source 900 including the gas supply unit 5 etc. in parallel with the object 6 to be processed. By a controller 1000 for controlling operations of the gas supply unit 5 and the high-frequency power source 8, the operations of the lower side-moving device 204 and the upper side-moving device 205 are controlled, and then, under the control of the controller 1000, the grounding electrode 7 is moved in parallel with the object 6 to be processed during the plasma processing, so that the plasma generated in the local plasma space PA is displaced following the grounding electrode 7, and thus, etching is able to be effected on the desired pattern.

Figure 4:
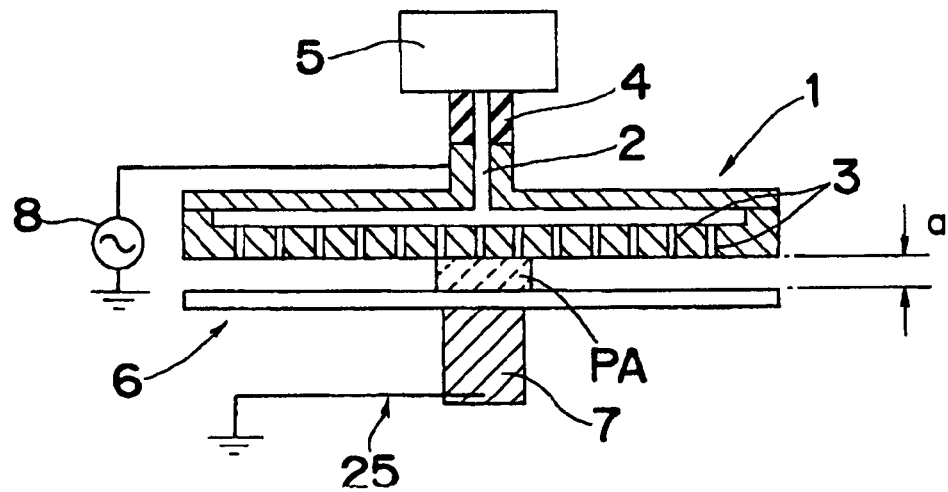
FIG. 4 is a sectional view showing the construction of the plasma processing apparatus employed in the first embodiment of the present invention.

Moreover, when etching was carried out as plasma processing by enlarging the surface of the grounding electrode 7 opposite to the object 6 to be processed to a 10-mm square shape as shown in FIG. 4 in the first embodiment of the present invention, a plasma was generated in the local plasma space PA on the object 6 to be processed, and thus, etching was able to be effected on the desired pattern. At this time, the plasma had an approximately 10-mm square parallel cross section.

Figure 5:
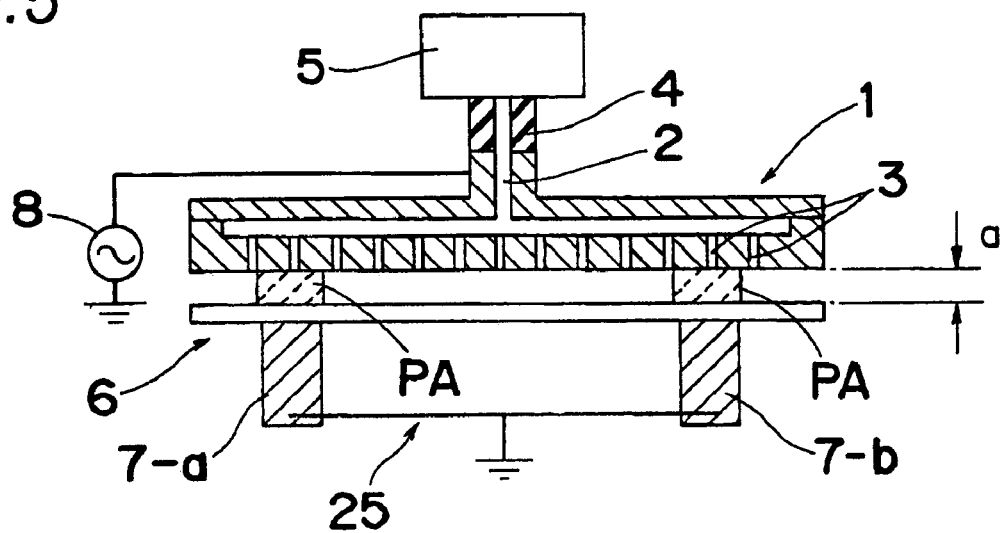
FIG. 5 is a sectional view showing the construction of the plasma processing apparatus employed in the first embodiment of the present invention.

Moreover, when etching was carried out as plasma processing by concurrently arranging two grounding electrodes 7-*a* and 7-*b* as shown in FIG. 5 in the first embodiment of the present invention, plasmas were generated only in two local plasma spaces PA and PA, and thus, etching was able to be effected on the desired pattern. It is to be noted that the area of the surface of the potentially controlled second electrode (grounding electrode 7) superposed on the object 6 to be processed is smaller than the area of the object 6 to be processed. Moreover, a distance between the plurality of potentially controlled second electrodes (grounding electrodes 7) is made larger than a distance between the plasma source and the object 6 to be processed.

Figure 42:
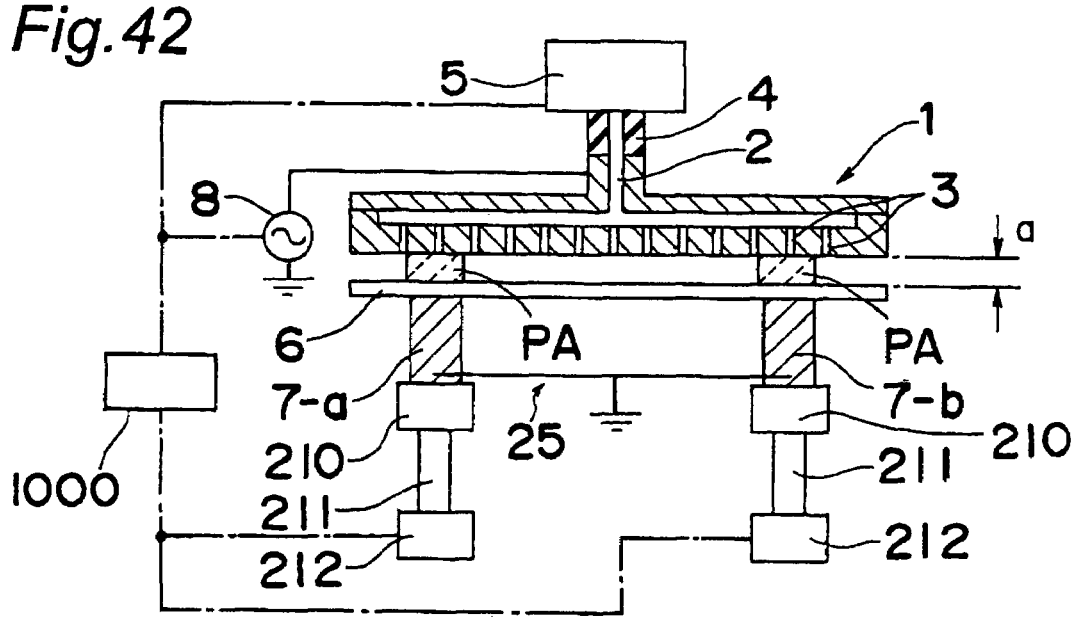
FIG. 42 is a sectional view showing a plasma processing apparatus with moving devices in a third modification of the first embodiment of the present invention.

The area of the surface of the potentially controlled second electrode (each of the grounding electrode 7-*a* and the grounding electrode 7-*b*) superposed on the object 6 to be processed is smaller than the area of the object 6 to be processed. Moreover, a distance between the plurality of potentially controlled second electrodes (each of the grounding electrode 7-*a* and the grounding electrode 7-*b*) is made larger than a distance between the plasma source and the object 6 to be processed. In the plasma apparatus of FIG. 7, as shown in FIG. 42, there can be provided with a moving device for independently moving each of the grounding electrode 7-*a* and the grounding electrode 7-*b* away from the object 6 to be processed. That is, the moving device for the grounding electrode 7-*a* includes: an insulating member 210 connected to the grounding electrode 7-*a*; a column 211 connected to the insulating member 210; and an elevating device 212 such as air cylinder, connected to the column 211, for capable of moving up and down the insulating member 210 together with the grounding electrode 7-*a* by moving up and down the column 211. The moving-way device for the grounding electrode 7-*b* includes: an insulating member 210 connected to the grounding electrode 7-*b*; a column 211 connected to the insulating member 210; and an elevating device 212 such as air cylinder, connected to the column 211, for capable of moving up and down the insulating member 210 together with the grounding electrode 7-*b* by moving up and down the column 211. By a controller 1000 for controlling operations of the gas supply unit 5 and the high-frequency power source 8, the elevating operations of the elevating devices 212 can be respectively and independently controlled. Thus, when under the control of the controller 1000, the grounding electrodes 7-*a* and 7-*b* are respectively and independently moved away from and moved close to the object 6 to be processed by the elevating devices 212 while the high-frequency power source 8 is turned on, the similar effects to the case where the high-frequency power source 8 is turned on and off can be obtained. Under the control of the controller 1000, the high-frequency power source 8 is turned off or the grounding electrodes 7-*a* and 7-*b* are moved away from the object 6 to be processed by the elevating devices 212, and thereafter, as shown in FIGS. 3 and 41 described below, the grounding electrodes 7-*a* and 7-*b* are moved and positioned to a desired position of the object 6 to be processed, discontinuous pattern can be drawn on the object 6 to be processed.

In the first embodiment of the present invention, it was discovered that etching as plasma processing of an arbitrary configuration was able to be effected on the quartz substrate employed as the object 6 to be processed according to the shape, the position, and the number of grounding electrodes 7 arranged in the positions opposite to the plasma source with interposition of the object 6 to be processed by the plasma source equipped with the flat electrode section 1.

The reason why the size and the position of occurrence of the plasma are changed as described above depending on the size and the position of the potentially controlled electrode will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the potentially controlled electrode by arranging the potentially controlled electrode in the vicinity of the plasma source to which the high frequency was applied, and the plasma was able to be locally generated.

The second embodiment of the present invention will be described next with reference to FIGS. 6 through 10.

Figure 6:
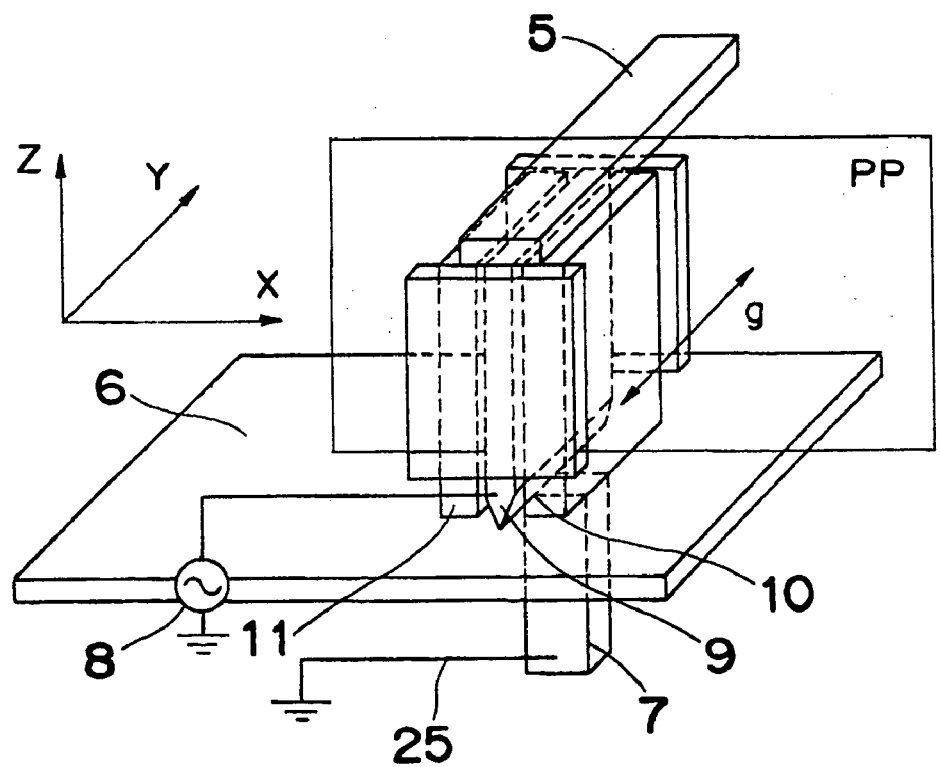
FIG. 6 is a perspective view showing the construction of a plasma processing apparatus employed in a second embodiment of the present invention.
Figure 7:
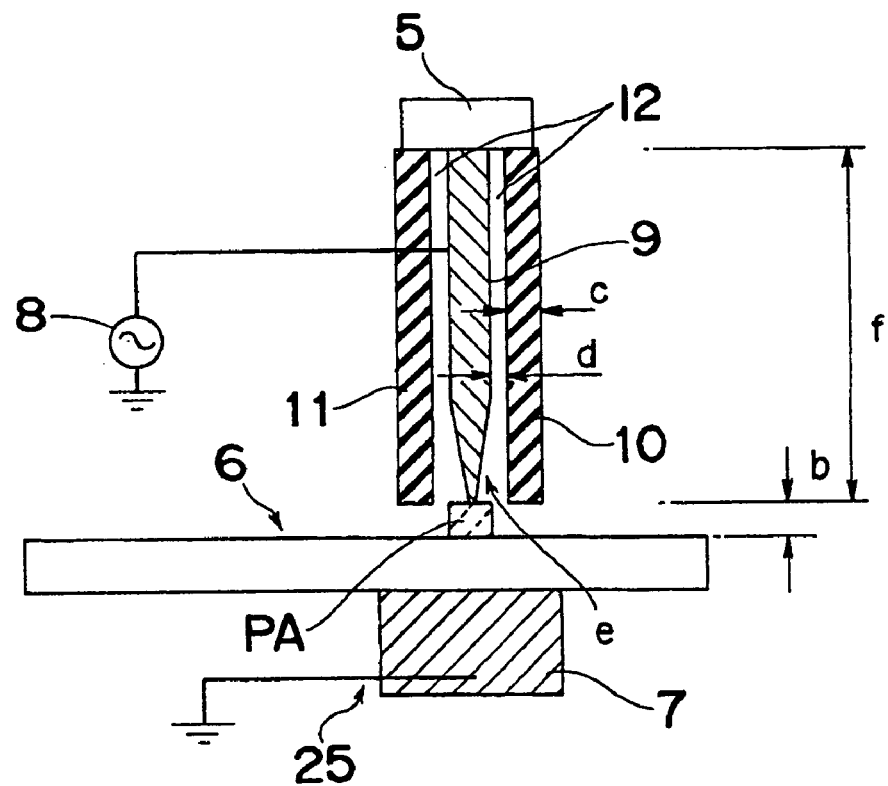
FIG. 7 is a sectional view showing the construction of the plasma processing apparatus employed in the second embodiment of the present invention.

FIG. 6 shows a perspective view of a plasma processing apparatus including a plasma source equipped with a knife-edge electrode section 9 employed in the second embodiment of the present invention. FIG. 7 shows a sectional view taken along the plane PP of FIG. 6. Referring to FIGS. 6 and 7, insulating plates 10 and 11 are arranged in positions where their plate surfaces are parallel to the knife-edge electrode section 9, and gas can be supplied almost perpendicularly to an object 6 to be processed from a gas supply unit 5 via a gas passage 12. By arranging a grounding electrode 7 as an electrode potentially controlled via wiring 25 in a position opposite to the plasma source with interposition of the object 6 to be processed and supplying a high-frequency power of 13.56 MHz from a high-frequency power source 8 to the knife-edge electrode section 9 while supplying the gas from the gas supply unit 5, plasma can be generated in a local plasma space PA, and thus, the object 6 to be processed can be processed with the plasma. A distance "b" between the plasma source and the object 6 to be processed is 0.5 mm, and widths "c" of the knife-edge electrode section 9 and the insulating plates 10 and 11 are 1 mm, respectively. A width "d" of the gas passage 12 is 0.1 mm, and an acute angle of an edge-portion "-e" of the knife-edge electrode section is 60°. The plate surfaces of the knife-edge electrode section 9 and the insulating plates 10 and 11 have a height "f" of 50 mm and a line direction length "g" of 30 mm. The surface of the grounding electrode 7 opposite to the object 6 to be processed is a square of a side length of 5 mm.

The plasma source, which is operable from several pascals to several atmospheres, operates typically within a range of 10000 Pa to about three atmospheres. In particular, the operation in the vicinity of the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied, quartz as the object 6 to be processed was etched as plasma processing. Consequently, a plasma was generated only in the local plasma space PA, and thus, etching was able to be effected on the desired pattern. At this time, the cross section of the plasma space PA parallel to the object 6 to be processed had a width "c" of about 1 mm and a line direction length "g" of about 5 mm.

Figure 8:
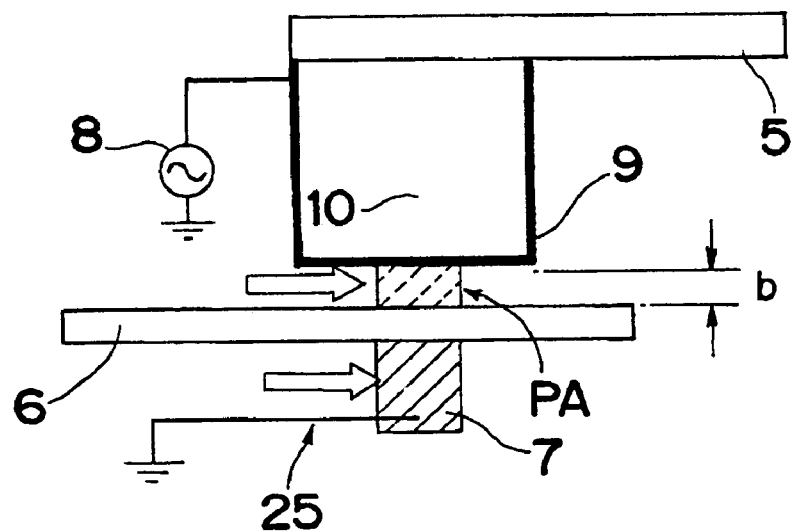
FIG. 8 is a sectional view showing the construction of the plasma processing apparatus employed in the second embodiment of the present invention.

In the second embodiment of the present invention, by displacing the grounding electrode 7 parallel to the object 6 to be processed during etching as plasma processing as shown in FIG. 8, the plasma generated in the local plasma space PA was displaced following the grounding electrode 7 in parallel, and thus, etching was able to be effected on the desired pattern.

Figure 43:
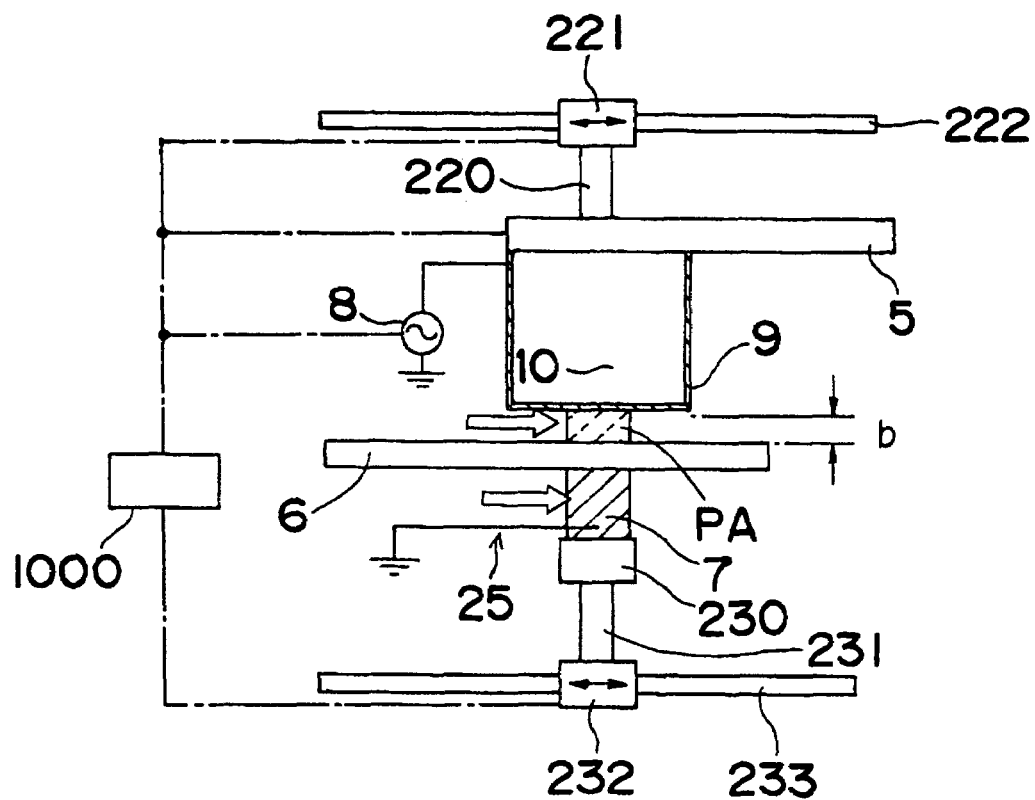
FIG. 43 is a sectional view showing a plasma processing apparatus with a moving device in a modification of the second embodiment of the present invention.

FIG. 43 shows a moving device for moving the grounding electrode 7 of FIG. 8 in parallel with the object 6 to be processed. In FIG. 43, reference numeral 220 denotes a column connected to the gas supply unit 5; 221 denotes an upper side-moving device connected to the column 220, having the function of the elevating device such as an air cylinder for moving up and down the column 220 together with a plasma source 900 including the gas supply unit 5 etc. by moving up and down the column 220, and having a linear slider mechanism for moving the plasma source 900 including the gas supply unit 5 etc. in parallel with the object 6 to be processed; and 222 denotes a rail for guiding the movement of the upper side-moving device 221. Reference numeral 230 denotes an insulating member connected to the grounding electrode 7; 231 denotes a column connected to the insulating member 230; 232 denotes a lower side-moving device connected to the column 231, having the function of the elevating device such as an air cylinder for moving up and down the insulating member 230 together with the grounding electrode 7 by moving up and down the column 231, and having a linear slider mechanism for moving the grounding electrode 7 etc. in parallel with the object 6 to be processed; 233 denotes a rail for guiding the movement of the lower side-moving device 232. By a controller 1000 for controlling operations of the gas supply unit 5 and the high-frequency power source 8, the operations of the lower side-moving device 232 and the upper side-moving device 221 are controlled, and then, under the control of the controller 1000, the grounding electrode 7 is moved in parallel with the object 6 to be processed during the etching, so that the plasma generated in the local plasma space PA is displaced following the grounding electrode 7, and thus, etching is able to be effected on the desired pattern.

Here, the relative movement velocity of the grounding electrode 7 in this embodiment, the previous embodiments, and other embodiments is determined as follows. Assuming that a depth to be etched of the object to be processed is D (μm), a length in the direction of movement of the grounding electrode 7 is L (μm), and an etching rate is R (μm/min), then it is preferable that a movement velocity V of the grounding electrode 7 (μm/min) satisfies the expression: V=L·R/D. During processing such that the groundwork (substrate) appears when etching is effected, it is proper to satisfy the expression: V<L·R/D. If the etching selection ratio (selectivity) with respect to the groundwork is high, the etching depth can be prevented from becoming extremely greater than D.

When the grounding electrode 7 is relatively moved to the object 6 to be processed, the grounding electrode 7 and the object 6 to be processed may be moved while being in contact with each other. However, it is sometimes the case where cut chips are generated therebetween, and therefore, it is preferable to separate them by a prescribed distance. In this case, the distance is preferably 0.01 mm to 1 mm. It is extremely difficult to accurately keep the distance smaller than 0.01 mm, and this is undesirable. If the distance is greater than 1 mm, then the region in which a plasma is generated cannot be accurately controlled, and this is undesirable.

Figure 9:
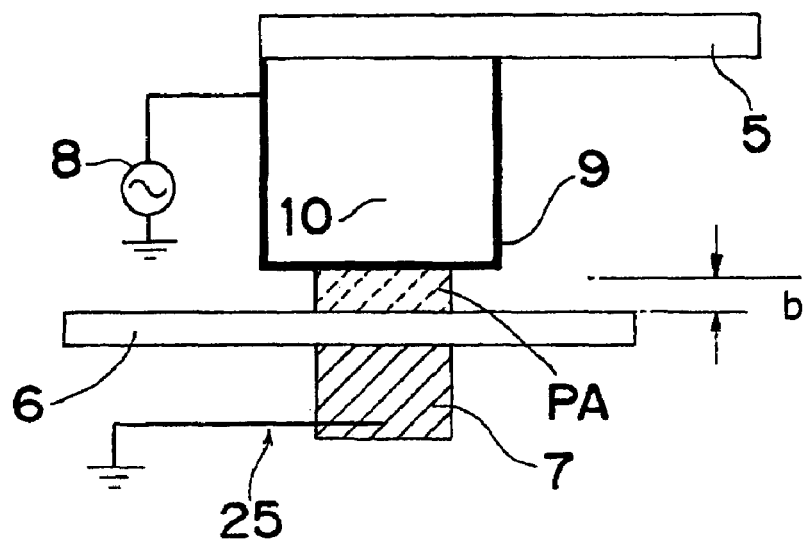
FIG. 9 is a sectional view showing the construction of the plasma processing apparatus employed in the second embodiment of the present invention.

Moreover, when etching was carried out as plasma processing by enlarging the surface of the grounding electrode 7 opposite to the object 6 to be processed to a 10-mm square shape as shown in FIG. 9 in the second embodiment of the present invention, a plasma was generated in the local plasma space PA on the object 6 to be processed, and thus, etching was able to be effected on the desired pattern. At this time, the parallel cross section of the plasma had a width "c" of about 1 mm and a line direction length "g" of about 10 mm.

Figure 10:
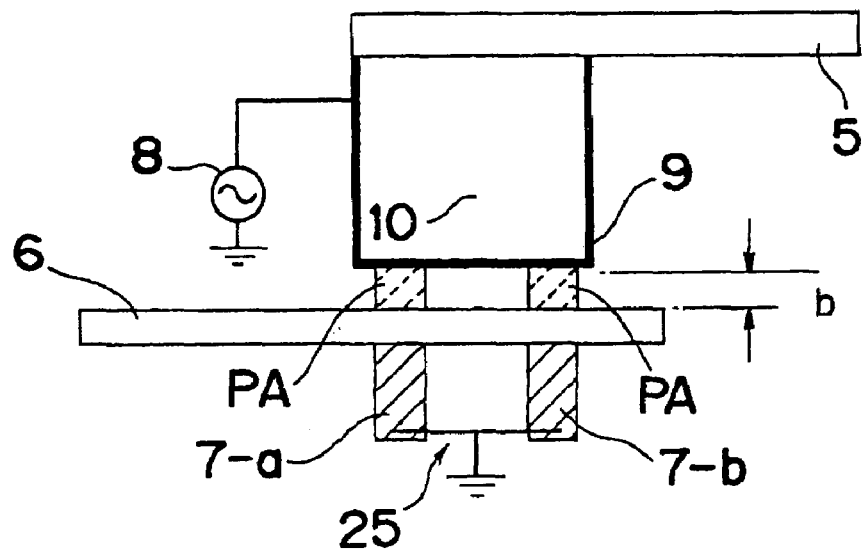
FIG. 10 is a sectional view showing the construction of the plasma processing apparatus employed in the second embodiment of the present invention.

Moreover, when etching was carried out as plasma processing by concurrently arranging two grounding electrodes 7-a and 7-b as shown in FIG. 10 in the second embodiment of the present invention, plasmas were generated only in two local plasma spaces PA and PA, and thus, etching was able to be effected on the desired pattern.

In the second embodiment of the present invention, it was formed that etching as plasma processing of an arbitrary configuration was able to be effected on the quartz substrate employed as the object 6 to be processed according to the shape, the position, and the number of grounding electrodes 7 arranged in the positions opposite to the plasma source with interposition of the object 6 to be processed by the plasma source equipped with the knife-edge electrode section 9.

The reason why the size and the position of occurrence of the plasma are changed as described above depending on the size and the position of the potentially controlled electrode will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the potentially controlled electrode by arranging the potentially controlled electrode in the vicinity of the plasma source to which the high frequency was applied, and thus, the plasma was able to be locally generated.

The third embodiment of the present invention will be described next with reference to FIGS. 11 and 12.

Figure 11:
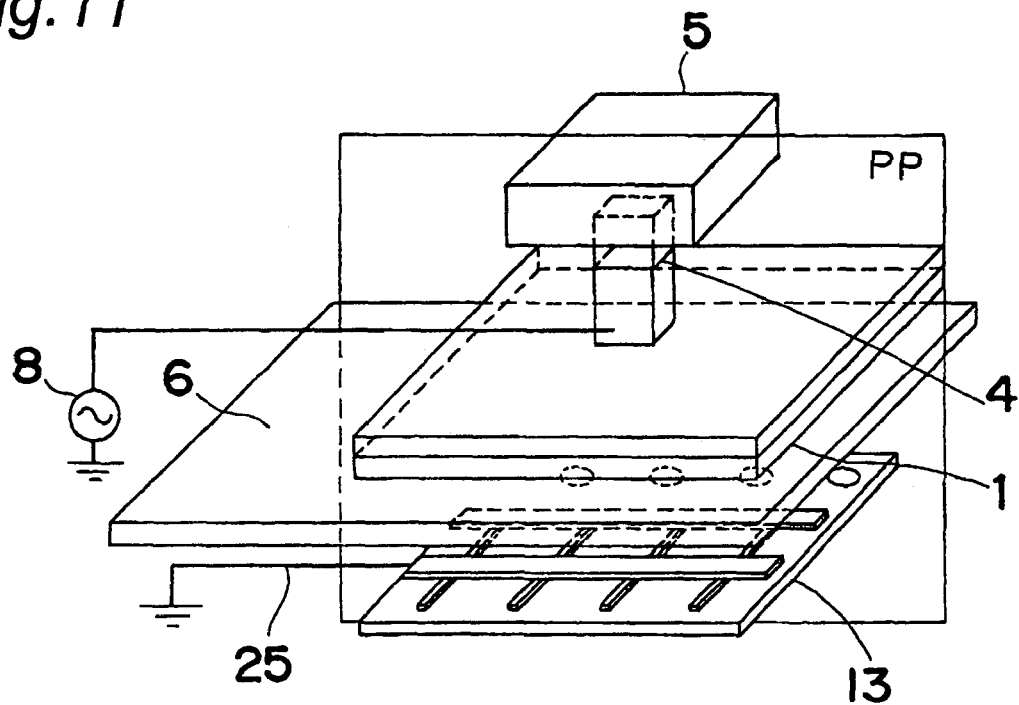
FIG. 11 is a perspective view showing the construction of a plasma processing apparatus employed in a third embodiment of the present invention
Figure 12:
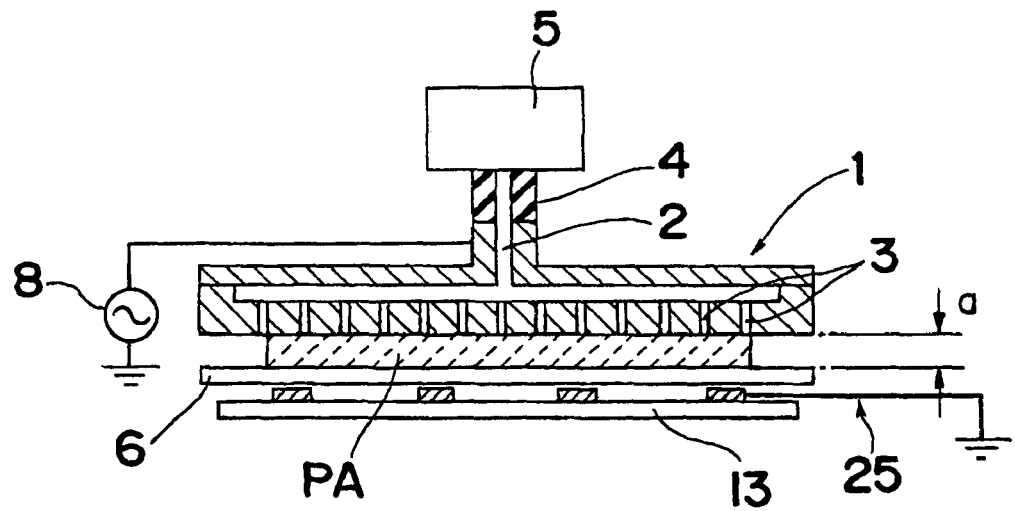
FIG. 12 is a sectional view showing the construction of the plasma processing apparatus employed in the third embodiment of the present invention.

FIG. 11 shows a perspective view of a plasma processing apparatus including a plasma source equipped with a flat electrode section 1 employed in the third embodiment of the present invention. FIG. 12 shows a sectional view taken along the plane PP of FIG. 11. Referring to FIGS. 11. and 12, a gas passage 2 and gas supply holes 3 are formed in a flat electrode section 1, and gas can be supplied almost perpendicularly to an object 6 to be processed via the gas passage 2 and the gas supply holes 3 from a gas supply unit 5 electrically insulated from the flat electrode section 1 by an insulator 4. By arranging a grounding electrode 13 of an arbitrary configuration as an electrode potentially controlled via wiring 25 in a position opposite to the plasma source with interposition of the object 6 to be processed and supplying a high-frequency power of 13.56 MHz from a high-frequency power source 8 to the flat electrode section 1 while supplying the gas from the gas supply unit 5, a plasma of an arbitrary configuration can be generated in a local plasma space PA, and thus, the object 6 to be processed can be processed with a plasma. A distance "a" between the plasma source and the object 6 to be processed is 0.5 mm.

The plasma source, which is operable from several pascals to several atmospheres, operates typically within a range of 10000 Pa to about three atmospheres. In particular, the operation in the vicinity of the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied, quartz as the object 6 to be processed was etched as plasma processing. Consequently, a plasma of an arbitrary configuration was generated in the local plasma space PA, and thus, etching was able to be effected on the desired pattern.

In the third embodiment of the present invention, the plasma source equipped with the flat electrode section 1 enabled the etching to be effected as plasma processing of an arbitrary configuration on the quartz substrate employed as the object 6 to be processed by the grounding electrode 13 of an arbitrary configuration arranged in a position opposite to the plasma source with interposition of the object 6 to be processed.

The reason why the size and the position of occurrence of the plasma are changed as described above depending on the size and the position of the potentially controlled electrode will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the potentially controlled electrode by arranging the potentially controlled electrode in the vicinity of the plasma source to which the high frequency was applied, and thus, the plasma was able to be locally generated.

The fourth embodiment of the present invention will be described next with reference to FIGS. 13 and 14.

Figure 13:
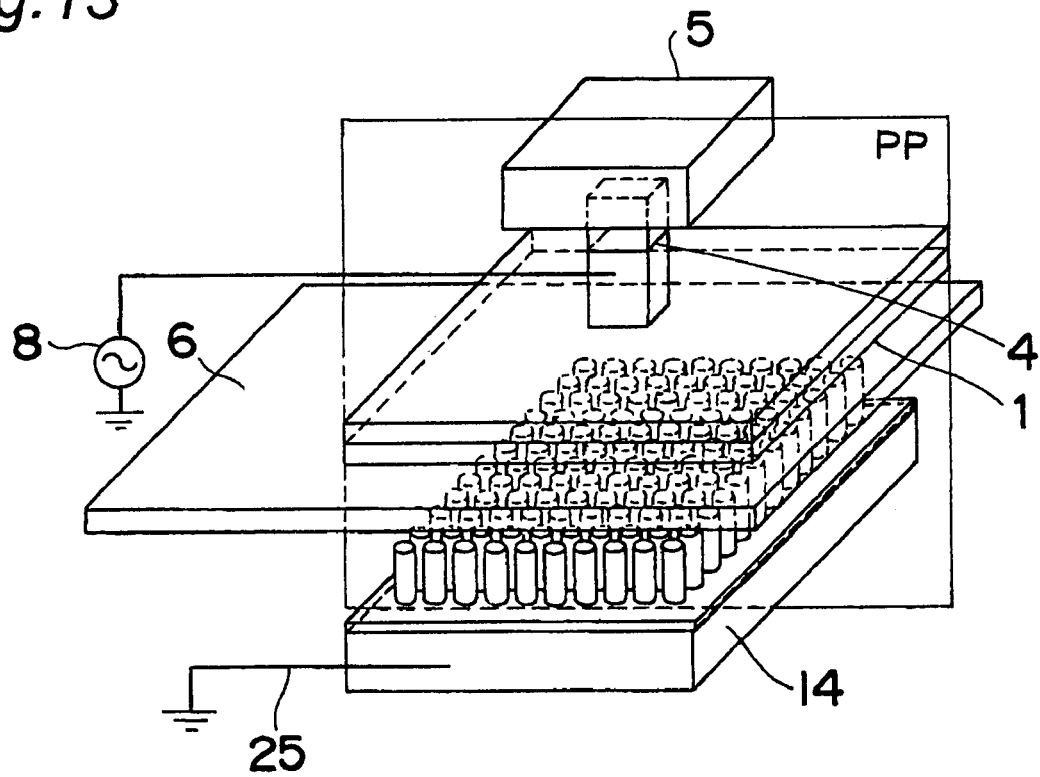
FIG. 13 is a perspective view showing the construction of a plasma processing apparatus employed in a fourth embodiment of the present invention
Figure 14:
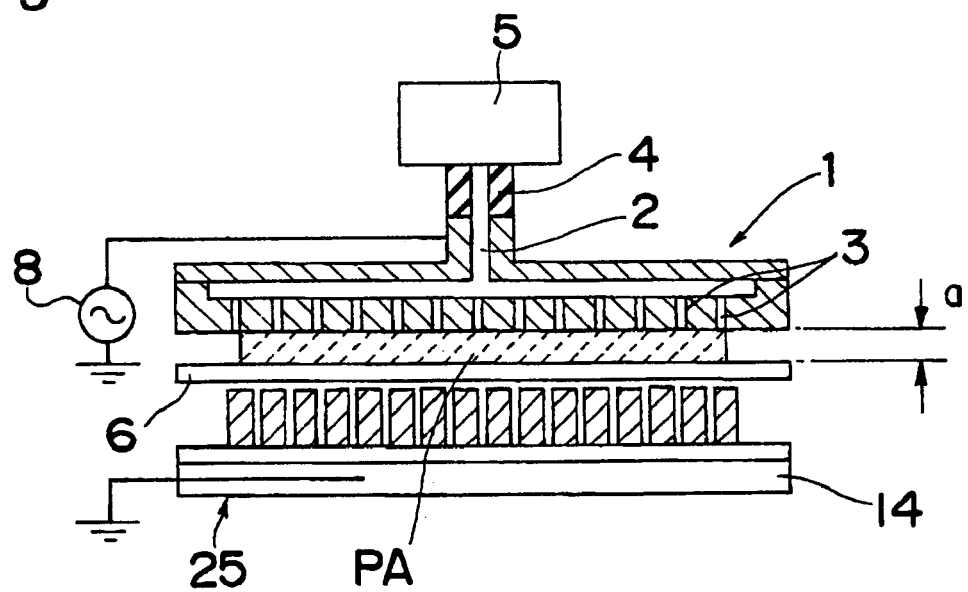
FIG. 14 is a sectional view showing the construction of the plasma processing apparatus employed in the fourth embodiment of the present invention.

FIG. 13 shows a perspective view of a plasma processing apparatus including a plasma source equipped with a flat electrode section 1 employed in the fourth embodiment of the present invention. FIG. 14 shows a sectional view taken along the plane PP of FIG. 13. Referring to FIGS. 13 and 14, a gas passage 2 and gas supply holes 3 are formed in a flat electrode section 1, and gas can be supplied almost perpendicularly to an object 6 to be processed via the gas supply unit 2 and the gas supply holes 3 from a gas supply unit 5 electrically insulated from the flat electrode section 1 by an insulator 4. By arranging a grounding electrode unit 14, which has a plurality of dot-shaped microelectrodes in positions opposite to the plasma source with interposition of the object 6 to be processed and is able to selectively make each dot have the ground potential, as an electrode potentially controlled via wiring 25 and supplying a high-frequency power of 13.56 MHz to the flat electrode section 1 from a high-frequency power source 8 while supplying the gas from the gas supply unit 5, a plasma of an arbitrary configuration can be generated in a local plasma space PA, and thus, the object 6 to be processed can be processed with the plasma. A distance "a" between the plasma source and the object 6 to be processed is 0.5 mm. It is to be noted that a switching element of a relay or the like is provided in the grounding electrode unit 14, allowing the electrodes to be selectively made to have the ground potential.

The plasma source, which is operable from several pascals to several atmospheres, operates typically within a range of 10000 Pa to about three atmospheres. In particular, the operation in the vicinity of the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied, quartz as the object 6 to be processed was etched as plasma processing. Consequently, by selectively making an arbitrary dot-shaped microelectrode(s) have the ground potential by the grounding electrode unit 14, a plasma of a shape equivalent to an arbitrary dot-like minute shape made to have the ground potential in the local plasma space PA is generated, and thus, etching was able to be effected on the desired pattern.

In the fourth embodiment of the present invention, the plasma source equipped with the flat electrode section 1 enabled the etching to be effected as plasma processing of an arbitrary configuration on the quartz substrate employed as the object 6 to be processed by the grounding electrode unit 14, which had the plurality of dot-shaped microelectrodes in the positions opposite to the plasma source with interposition of the object 6 to be processed and was able to selectively make each dot have the ground potential.

The reason why the size and the position of occurrence of the plasma are changed as described above depending on the size and the positions of the potentially controlled electrodes will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the potentially controlled electrode by arranging the potentially controlled electrode in the vicinity of the plasma source to which the high frequency was applied, and thus, the plasma was able to be locally generated.

The fifth embodiment of the present invention will be described next with reference to FIGS. 15 and 16.

Figure 15:
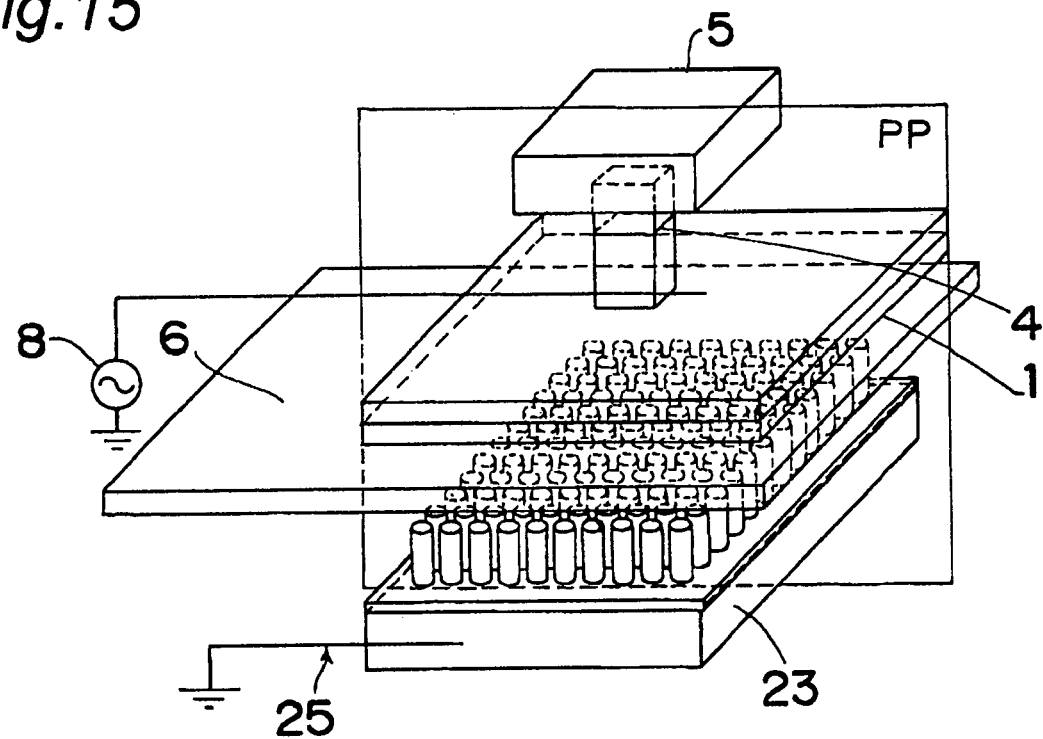
FIG. 15 is a perspective view showing the construction of a plasma processing apparatus employed in a fifth embodiment of the present invention
Figure 16:
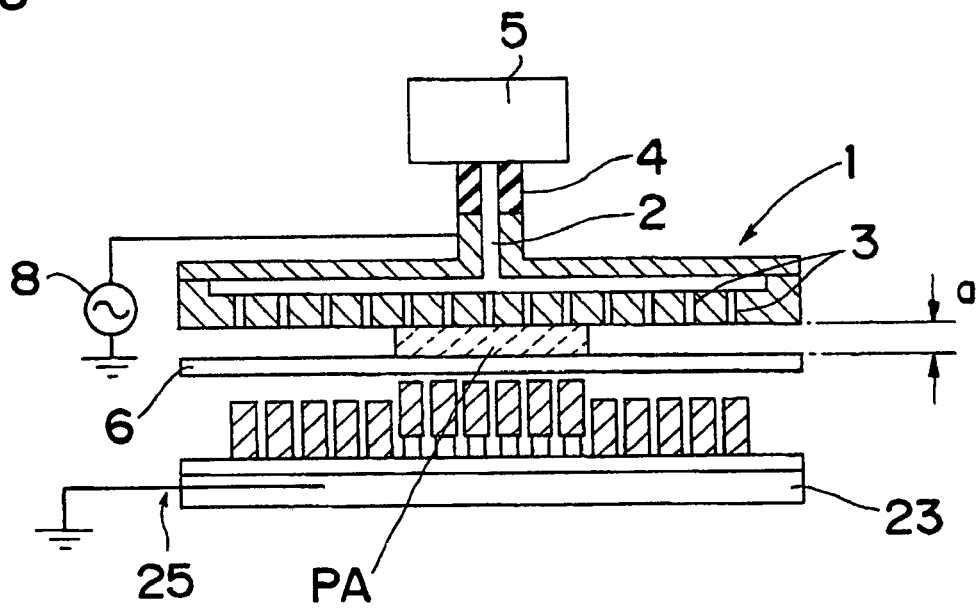
FIG. 16 is a sectional view showing the construction of the plasma processing apparatus employed in the fifth embodiment of the present invention.

FIG. 15 shows a perspective view of a plasma processing apparatus including a plasma source equipped with a flat electrode section 1 employed in the fifth embodiment of the present invention. FIG. 16. shows a sectional view taken along the plane PP of FIG. 15. Referring to FIGS. 15 and 16, a gas passage 2 and gas supply holes 3 are formed in the flat electrode section 1, and gas can be supplied almost perpendicularly to an object 6 to be processed via the gas supply unit 2 and the gas supply holes 3 from a gas supply unit 5 electrically insulated from the flat electrode section 1 by an insulator 4. By arranging a grounding electrode unit 23 having moving devices 265, which has a plurality of dot-shaped microelectrodes 23a in positions opposite to the plasma source with interposition of the object 6 to be processed and is able to selectively bring arbitrary microelectrodes 23a made to have the ground potential, close to the object 6 to be processed, as an electrode potentially controlled via wiring 25 and supplying a high-frequency power of 13.56 MHz to the flat electrode section 1 from a high-frequency power source 8 while supplying the gas from the gas supply unit 5, a plasma of an arbitrary configuration can be generated in a local plasma space PA, and thus, the object 6 to be processed can be processed with the plasma. A distance "a" between the plasma source and the object 6 to be processed is 0.5 mm.

The plasma source, which is operable from several pascals to several atmospheres, operates typically within a range of 10000 Pa to about three atmospheres. In particular, the operation at and about the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied, quartz as the object 6 to be processed was etched as plasma processing. Consequently, by selectively bringing arbitrary microelectrodes 23a made to have the ground potential, close to the object 6 to be processed by the grounding electrode unit 23 having the moving devices 265, a plasma was generated in the local plasma space PA only in the place where the microelectrode(s) is brought close to the object 6 to be processed, and thus, etching was able to be effected on the desired pattern.

Figure 44:
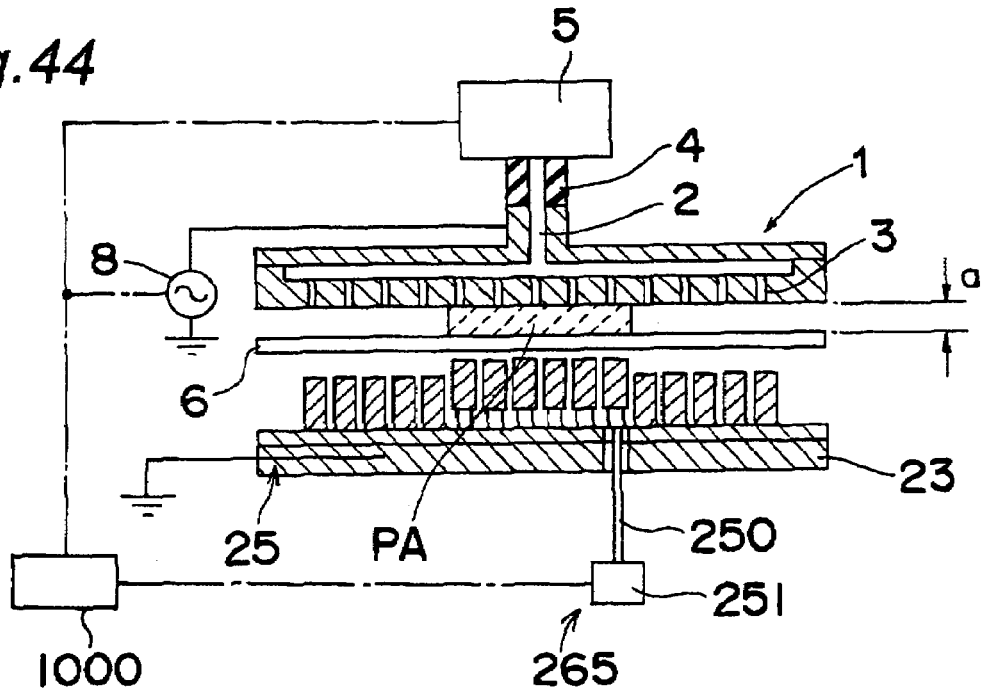
FIG. 44 is a sectional view showing a plasma processing apparatus with moving devices in a first modification of the fifth embodiment of the present invention.

FIG. 44 shows moving devices 265 for selectively bring arbitrary microelectrodes 23a made to have the ground potential, close to the object 6 to be processed, by the grounding electrode unit 23. In FIG. 44, in order to easily understand it, only one moving device 265 of the moving devices 265 is shown. Each microelectrode 23a has one moving device 265. Each moving device 265 includes: a column 250 movably penetrating the grounding electrode unit 23 and connected to the microelectrode 23a; and an elevating device 251 for elevating the column 250 to move the microelectrode 23a to position at a position close to the object 6 to be processed and a position away therefrom. By a controller 1000 for controlling operations of the gas supply unit 5 and the high-frequency power source 8, the moving devices 265 are selectively driven to selectively bring the arbitrary microelectrodes 23a made to have the ground potential, close to the object 6 to be processed, and then, a plasma is generated in the local plasma space PA only in the place where the microelectrodes are brought close to the object 6 to be processed, and thus, etching is able to be effected on the desired pattern of the object 6 to be processed.

Figure 45:
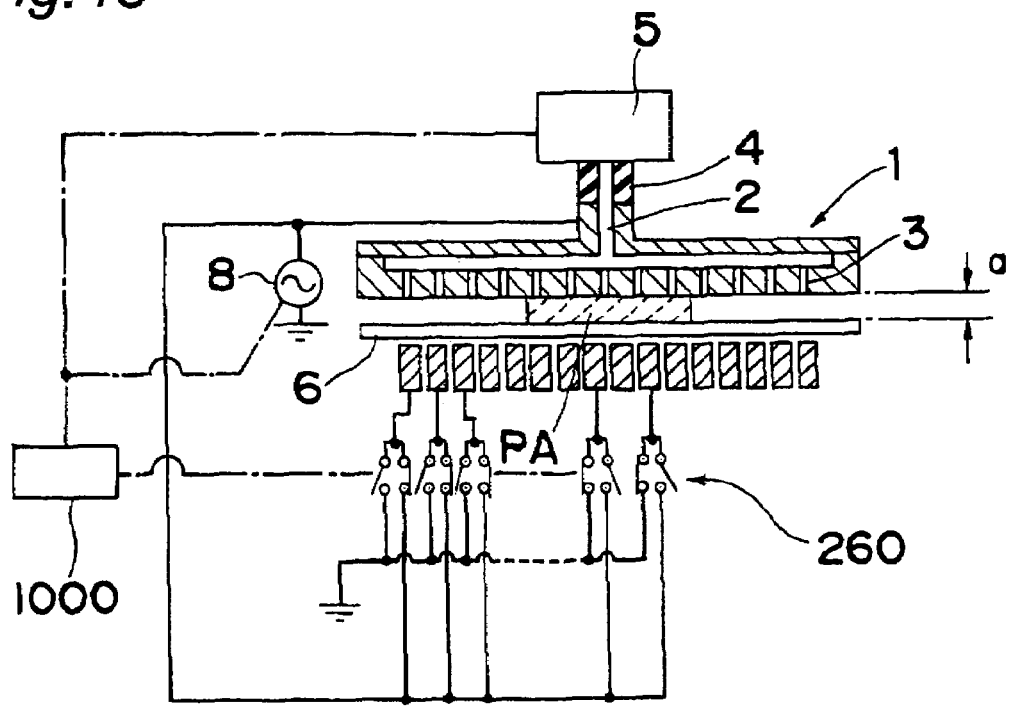
FIG. 45 is a sectional view showing a plasma processing apparatus with switching mechanisms and wiring in a second modification of the fifth embodiment of the present invention.

Instead of selectively bringing the microelectrodes 23*a* close to the object 6 to be processed by the moving devices 265, as shown in FIG. 45, the microelectrodes 23*a* may be electrically and selectively connected to either the high-frequency power source 8 or the ground potential. That is, instead of the provision of the moving devices 265, as shown in FIG. 45, there are switching mechanisms 260; wiring for electrically connecting each microelectrode 23*a* to the high-frequency power source 8 via a first switch of the switching mechanisms 260; and wiring for electrically connecting to each microelectrode 23*a* the ground potential via a second switch of the switching mechanisms 260. Thus, either one switch of the first and second switches of the switching mechanisms 260 is turned on while the other is turned off in each microelectrode 23*a*. The switching operations of the switching mechanisms 260 are respectively and independently controlled by the controller 1000. Thus, since in each of the microelectrodes (two switching mechanisms 260 on the right side of FIG. 45) 23*a* electrically connected to the high-frequency power source 8, a potential difference between the microelectrode 23*a* and the flat electrode section 1 is zero and thus the microelectrodes 23*a* do not serve as grounding electrodes, resulting in no plasma generation. Contrarily, since in each of the microelectrodes (three switching mechanisms 260 on the left side of FIG. 45) 23*a* electrically connected to the grounding electrode 8., there is a potential difference between the microelectrode 23*a* and the flat electrode section 1 and thus the microelectrodes 23*a* can serve as grounding electrodes, resulting in plasma generation.

In the fifth embodiment of the present invention, the plasma source equipped with the flat electrode section 1 enabled the etching to be effected as plasma processing of an arbitrary configuration on the quartz substrate employed as the object 6 to be processed by the grounding electrode unit 23 having the moving devices, which had the plurality of dot-shaped microelectrodes in the positions opposite to the plasma source with interposition of the object 6 to be processed and was able to selectively bring the arbitrary microelectrodes made to have the ground potential, close to the object 6 to be processed.

The reason why the size and the position of occurrence of the plasma are changed as described above depending on the size and the position of the potentially controlled electrode will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the potentially controlled electrode by arranging the potentially controlled electrode in the vicinity of the plasma source to which the high frequency was applied, and thus, the plasma was able to be locally generated.

The sixth embodiment of the present invention will be described next with reference to FIGS. 17 through 21.

Figure 17:
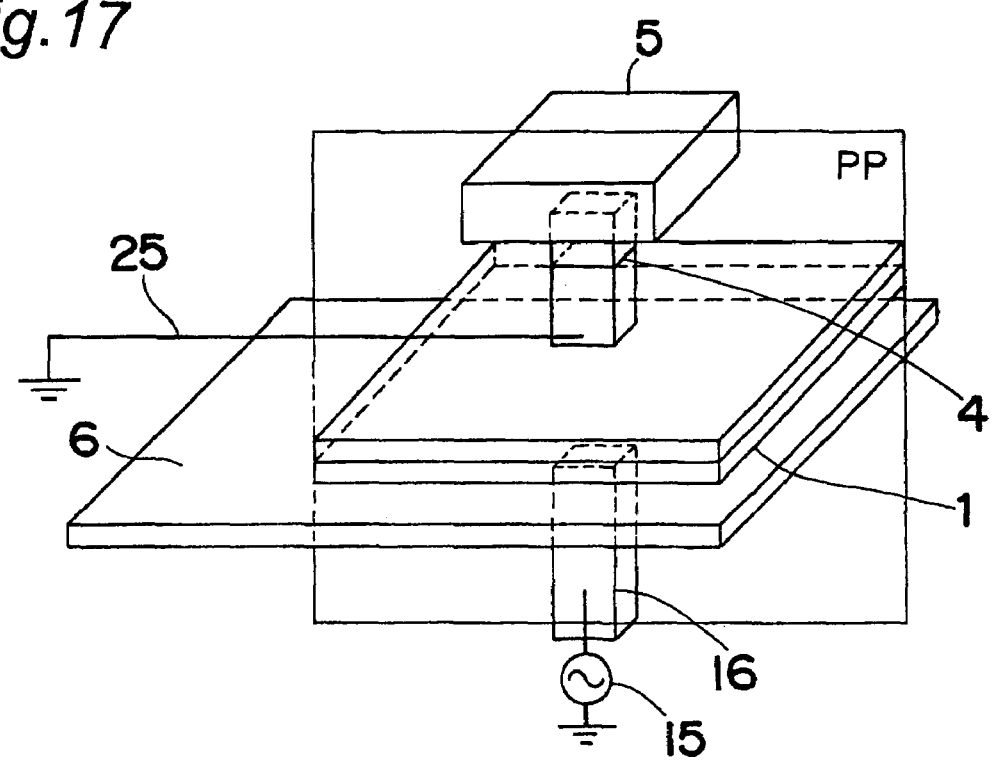
FIG. 17 is a perspective view showing the construction of a plasma processing apparatus employed in a sixth embodiment of the present invention
Figure 18:
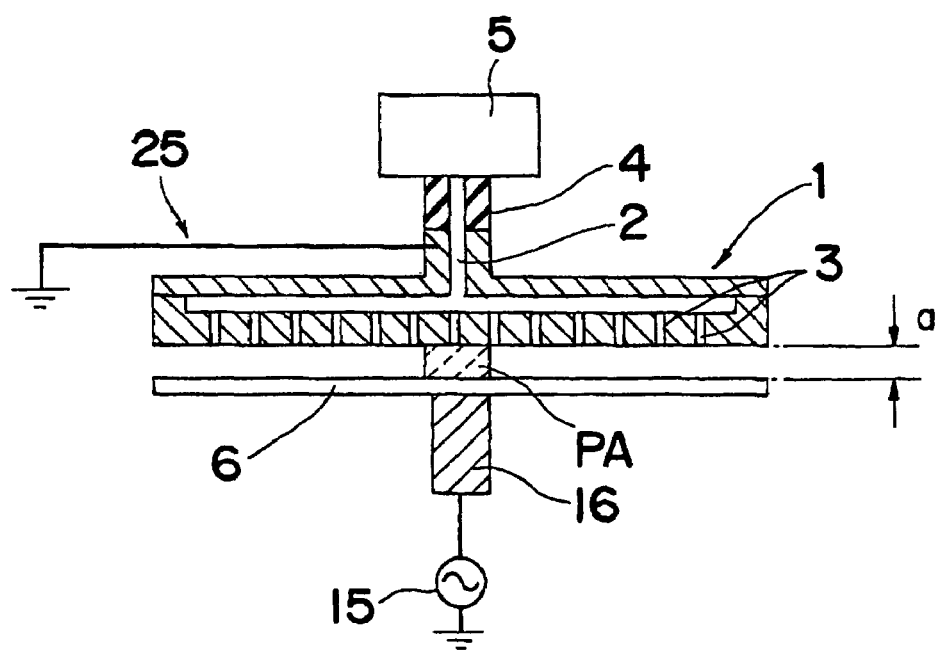
FIG. 18 is a sectional view showing the construction of the plasma processing apparatus employed in the sixth embodiment of the present invention.

FIG. 17 shows a perspective view of a plasma processing apparatus including a plasma source equipped with a flat electrode section 1 employed in the sixth embodiment of the present invention. FIG. 18 shows a sectional view taken along the plane PP of FIG. 17. Referring to FIGS. 17 and 18, a gas passage 2 and gas supply holes 3 are formed in the flat electrode section 1, and gas can be supplied almost perpendicularly to an object 6 to be processed via the gas supply unit 2 and the gas supply holes 3 from a gas supply unit 5 electrically insulated from the flat electrode section 1 by an insulator 4.

By arranging an electrode 16, which supplies a high-frequency power from a high-frequency power source 15, in a position opposite to the plasma source including the flat electrode section 1 potentially controlled as a grounding electrode via wiring 25 with interposition of the object 6 to be processed and supplying a high-frequency power of 13.56 MHz from a high-frequency power source 15 to the electrode 16 while supplying the gas from a gas supply unit 5, a plasma can be generated in a local plasma space PA, and thus, the object 6 to be processed can be processed with the plasma. A distance "a" between the plasma source and the object 6 to be processed is 0.5 mm. Moreover, the surface of the flat electrode section 1 opposite to the object 6 to be processed is a square of a side length of 50 mm, and the surface of the electrode 16 for supplying the high-frequency power opposite to the object 6 to be processed is a square of a side length of 5 mm.

The plasma source, which is operable from several pascals to several atmospheres, operates typically within a range of 10000 Pa to about three atmospheres. In particular, the operation at and about the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied to the electrode 16, quartz as the object 6 to be processed was etched as plasma processing. Consequently, a plasma was generated only in the local plasma space PA, and thus, etching was able to be effected on the desired pattern. At this time, the plasma space PA had an approximately 5-mm square cross section parallel to the object 6 to be processed.

Figure 19:
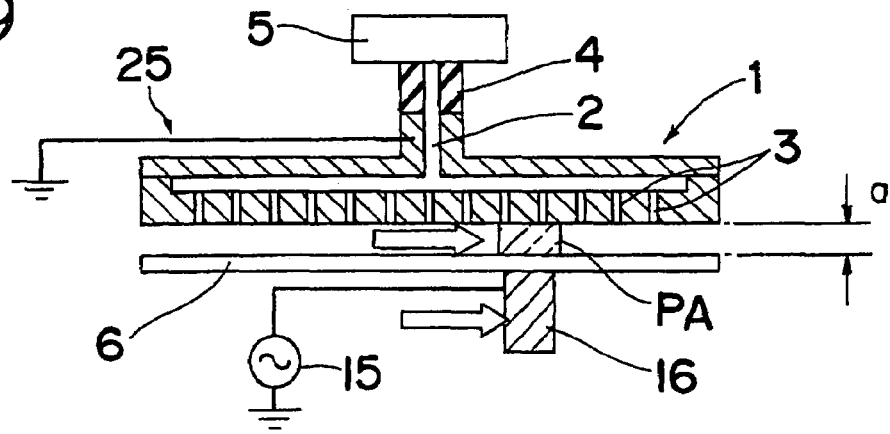
FIG. 19 is a sectional view showing the construction of the plasma processing apparatus employed in the sixth embodiment of the present invention

In the sixth embodiment of the present invention, by moving the electrode 16 for supplying the high-frequency power during etching as plasma processing, parallel to the object 6 to be processed as shown in FIG. 19, the plasma generated in the local plasma space PA moved following the electrode 16 for supplying the high-frequency power, and thus, etching was able to be effected on the desired pattern.

Figure 20:
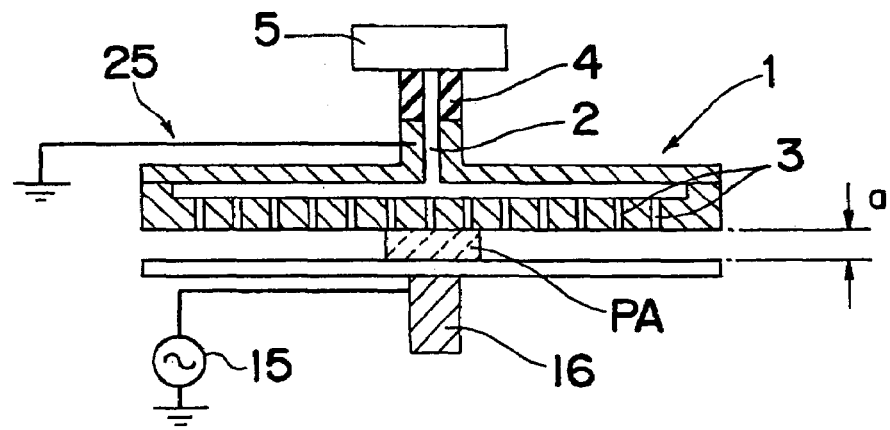
FIG. 20 is a sectional view showing the construction of the plasma processing apparatus employed in the sixth embodiment of the present invention

Moreover, when etching was carried out as plasma processing by enlarging the surface of the electrode 16 for supplying the high-frequency power opposite to the object 6 to be processed to a 10-mm square shape as shown in FIG. 20 in the sixth embodiment of the present invention, a plasma was generated in the local plasma space PA on the object 6 to be processed, and thus, etching was able to be effected on the desired pattern. At this time, the plasma had an approximately 10-mm square parallel cross section.

Figure 21:
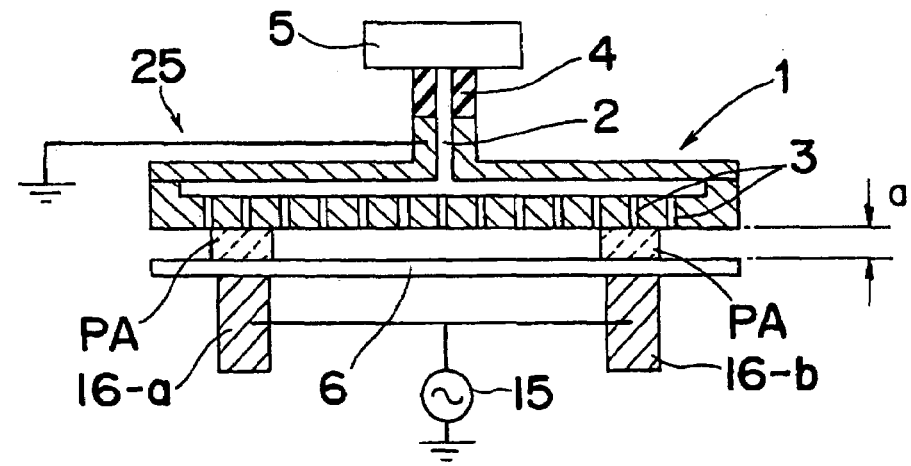
FIG. 21 is a sectional view showing the construction of the plasma processing apparatus employed in the sixth embodiment of the present invention

Moreover, when etching was carried out as plasma processing by concurrently arranging two electrodes 16-*a* and 16-*b* for supplying the high-frequency power as shown in FIG. 21 in the sixth embodiment of the present invention, plasmas were generated only in two local plasma spaces PA and PA, and thus, etching was able to be effected on the desired pattern.

In the sixth embodiment of the present invention, it was discovered that etching as plasma processing of an arbitrary configuration was able to be effected on the quartz substrate employed as the object 6 to be processed according to the shape, the position and the number of electrodes 16, to which the high-frequency power was supplied and are arranged in the positions opposite to the plasma source with interposition of the object 6 to be processed by the plasma source equipped with the flat electrode section 1.

The reason why the size and the position of occurrence of the plasma are changed as described above depending on the size and the positions of the electrodes to which the high frequency is applied will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the electrode by arranging the plasma source partially potentially controlled in the vicinity of the electrode to which the high frequency was applied, and thus, the plasma was able to be locally generated.

The seventh embodiment of the present invention will be described next with reference to FIGS. 22 through 26.

Figure 22:
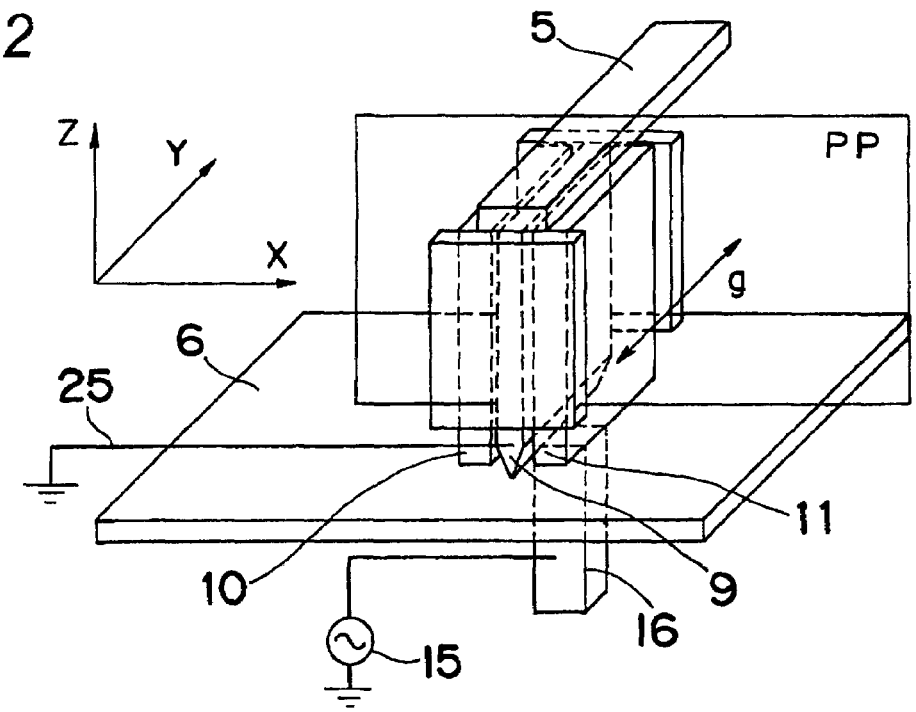
FIG. 22 is a perspective view showing the construction of a plasma processing apparatus employed in a seventh embodiment of the present invention.
Figure 23:
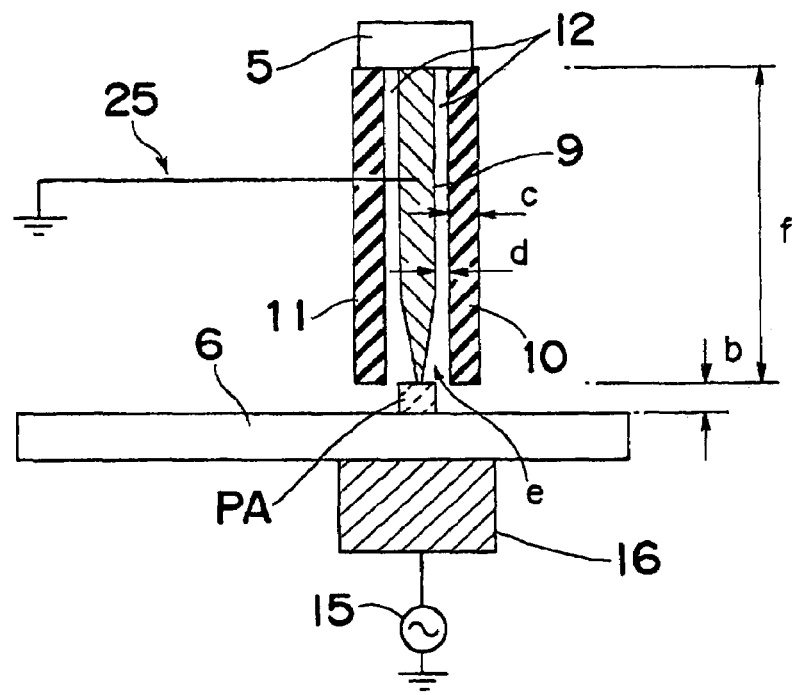
FIG. 23 is a sectional view showing the construction of the plasma processing apparatus employed in the seventh embodiment of the present invention.

FIG. 22 shows a perspective view of a plasma processing apparatus including a plasma source equipped with a knife-edge electrode section 9 employed in the seventh embodiment of the present invention. FIG. 23 shows a sectional view taken along the plane PP of FIG. 22. Referring to FIGS. 22 and 23, insulating plates 10 and 11 are arranged in positions where their plate surfaces are parallel to the knife-edge electrode section 9, and gas can be supplied almost perpendicularly to an object 6 to be processed from a gas supply unit 5 via a gas passage 12. By arranging an electrode 16, to which a high-frequency power is supplied from a high-frequency power source 15 in a position opposite to the plasma source including the knife-edge electrode section 9 potentially controlled as a grounding electrode via wiring 25 with interposition of the object 6 to be processed and supplying a high-frequency power of 13.56 MHz from the high-frequency power source 15 to the electrode 16 while supplying the gas from a gas supply unit 5, a plasma can be generated in a local plasma space PA, and thus, the object 6 to be processed can be processed with the plasma. A distance "b" between the plasma source and the object 6 to be processed is 0.5 mm, and widths "c" of the knife-edge electrode section 9 and the insulating plates 10 and 11 are 1 mm, respectively. A width "d" of the gas passage 12 is 0.1 mm, and an acute angle of an edge portion "e" of the knife-edge electrode section is 60°. The plate surfaces of the knife-edge electrode section 9 and the insulating plates 10 and 11 have a height "f" of 50 mm and a line direction length "g" of 30 mm. The surface of the electrode 16 for supplying the high-frequency power opposite to the object 6 to be processed is a square of a side length of 5 mm.

The plasma source, which is operable from several pascals to several atmospheres, operates typically within a range of 10000 Pa to about three atmospheres. In particular, the operation at and about the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied to the electrode 16, quartz as the object 6 to be processed was etched as plasma processing. Consequently, a plasma was generated only in the local plasma space PA, and etching was able to be effected on the desired pattern. At this time, the cross section of the plasma space PA parallel to the object 6 to be processed had a width "c" of about 1 mm and a line direction length "g" of about 5 mm.

Figure 24:
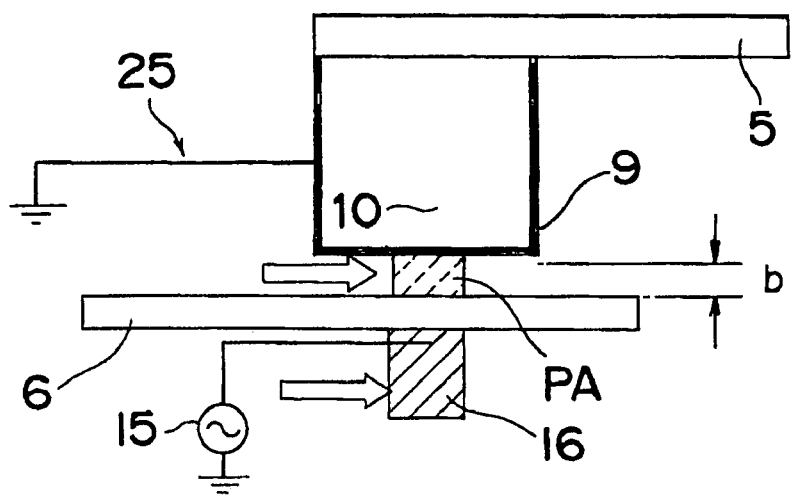
FIG. 24 is a sectional view showing the construction of the plasma processing apparatus employed in the seventh embodiment of the present invention.

In the seventh embodiment of the present invention, by moving the electrode 16 for supplying the high-frequency power during etching as plasma processing, parallel to the object 6 to be processed as shown in FIG. 24, the plasma generated in the local plasma space PA moved following the electrode 16 for supplying the high-frequency power in parallel, and thus, etching was able to be effected on the desired pattern.

Figure 25:
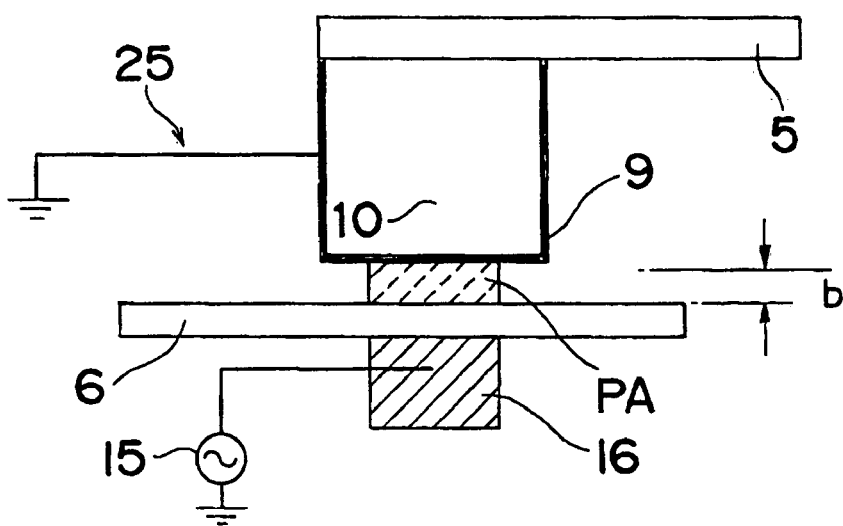
FIG. 25 is a sectional view showing the construction of the plasma processing apparatus employed in the seventh embodiment of the present invention.

Moreover, in the seventh embodiment of the present invention, when etching was carried out as plasma processing by enlarging the surface of the electrode 16 for supplying the high-frequency power opposite to the object 6 to be processed to a 10-mm square shape as shown in FIG. 25 in the seventh embodiment of the present invention, a plasma was generated in the local plasma space PA on the object 6 to be processed, and thus, etching was able to be effected on the desired pattern. At this time, it was visually confirmed that the parallel cross section of the plasma had a width "c" of about 1 mm and a line direction length "g" of about 10 mm.

Figure 26:
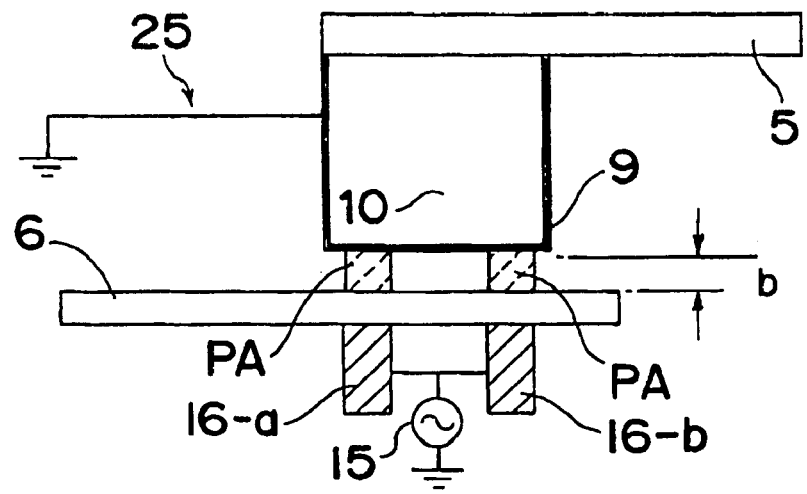
FIG. 26 is a sectional view showing the construction of the plasma processing apparatus employed in the seventh embodiment of the present invention.

Moreover, when etching was carried out as plasma processing by concurrently arranging two electrodes 16-a and 16-b for supplying the high-frequency power as shown in FIG. 26 in the seventh embodiment of the present invention, plasmas were generated only in two local plasma spaces PA and PA, and thus, etching was able to be effected on the desired pattern.

In the seventh embodiment of the present invention, it was discovered that etching as plasma processing of an arbitrary configuration was able to be effected on the quartz substrate employed as the object 6 to be processed according to the shape, the position, and the number of electrodes 16, to which the high-frequency power was supplied and are arranged in the positions opposite to the plasma source with interposition of the object 6 to be processed by the plasma source equipped with the knife-edge electrode section 9.

The reason why the size and the position of occurrence of the plasma are changed as described above depending on the size and the positions of the electrodes to which the high frequency is applied will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the electrode by arranging the plasma source partially potentially controlled in the vicinity of the electrode to which the high frequency was applied, and thus, the plasma was able to be locally generated.

The eighth embodiment of the present invention will be described next with reference to FIGS. 27 and 28.

Figure 27:
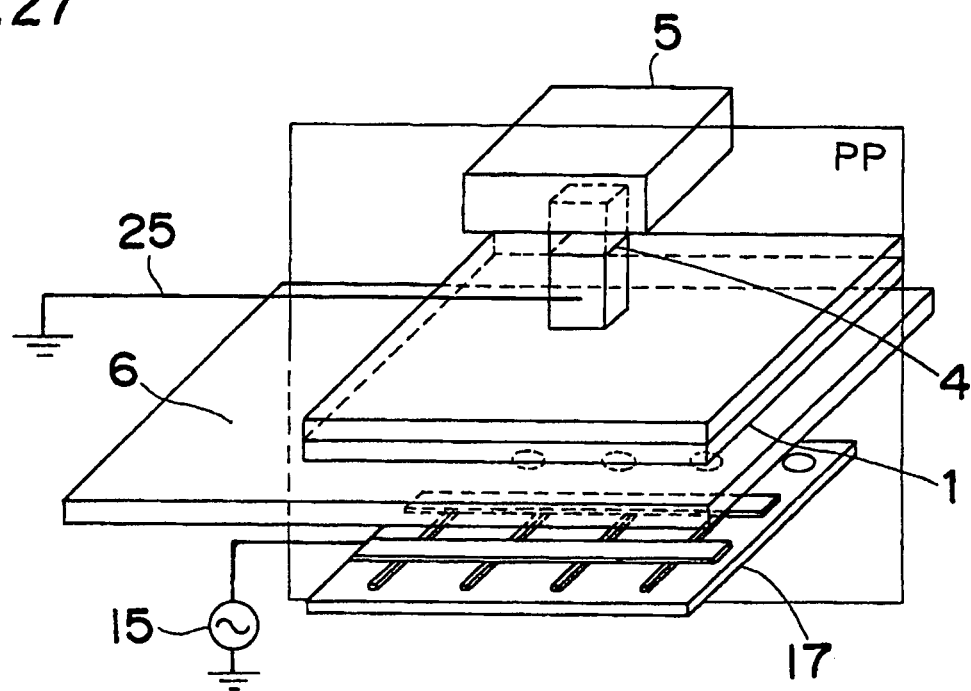
FIG. 27 is a perspective view showing the construction of a plasma processing apparatus employed in an eighth embodiment of the present invention.
Figure 28:
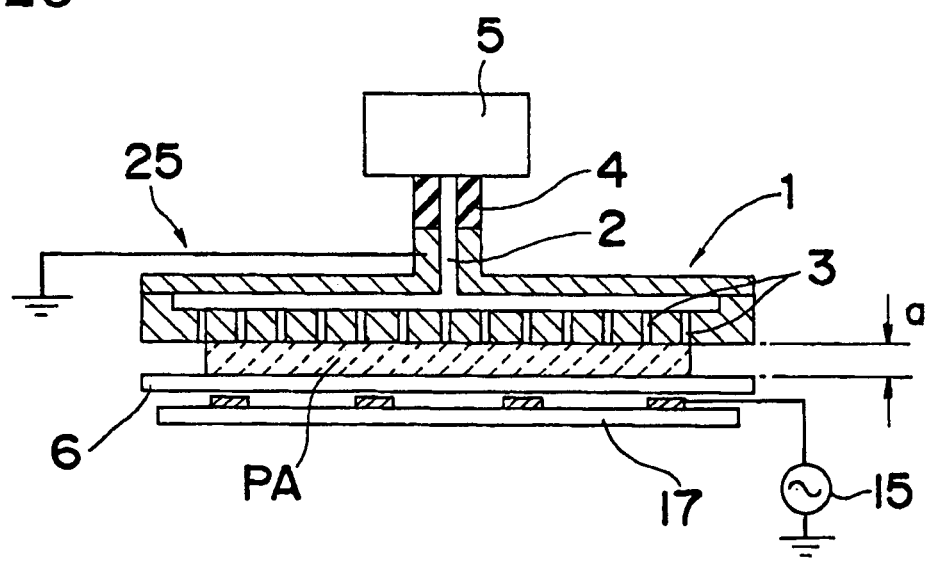
FIG. 28 is a sectional view showing the construction of the plasma processing apparatus employed in the eighth embodiment of the present invention.

FIG. 27 shows a perspective view of a plasma processing apparatus including a plasma source equipped with a flat electrode section 1 employed in the eighth embodiment of the present invention. FIG. 28 shows a sectional view taken along the plane PP of FIG. 27. Referring to FIGS. 27 and 28, a gas passage 2 and gas supply holes 3 are formed in the flat electrode section 1, and gas can be supplied almost perpendicularly to an object 6 to be processed via the gas supply unit 2 and the gas supply holes 3 from a gas supply unit 5 electrically insulated from the flat electrode section 1 by an insulator 4. By arranging a grounding electrode 17, which has an arbitrary configuration and supplies a high-frequency power from a high-frequency power source 15, in a position opposite to the plasma source including the flat electrode section 1 potentially controlled as a ground potential via wiring 25 with interposition of the object 6 to be processed and supplying a high-frequency power of 13.56 MHz from the high-frequency power source 15 to the grounding electrode 17 while supplying the gas from the gas supply unit 5, a plasma can be generated in a local plasma space PA, and thus, the object 6 to be processed can be processed with a plasma. A distance "a" between the plasma source and the object 6 to be processed is 0.5 mm.

The plasma source, which is operable from several pascals to several atmospheres, operates typically within a range of 10000 Pa to about three atmospheres. In particular, the operation at and about the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied to the electrode 16, quartz as the object 6 to be processed was etched as plasma processing. Consequently, a plasma was generated only in the local plasma space PA, thus, and etching was able to be effected on the desired pattern.

In the eighth embodiment of the present invention, the plasma source equipped with the flat electrode section 1 enabled the etching to be effected as plasma processing of an arbitrary configuration on the quartz substrate employed as the object 6 to be processed by the grounding electrode 17, which had an arbitrary configuration and was arranged in the position opposite to the plasma source with interposition of the object 6 to be processed.

The reason why the size and the position of occurrence of the plasma are changed as described above depending on the size and the positions of the electrodes to which the high frequency is applied will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the electrode by arranging the plasma source partially potentially controlled in the vicinity of the electrode to which the high frequency was applied, and thus, the plasma was able to be locally generated.

The ninth embodiment of the present invention will be described next with reference to FIGS. 29 and 30.

Figure 29:
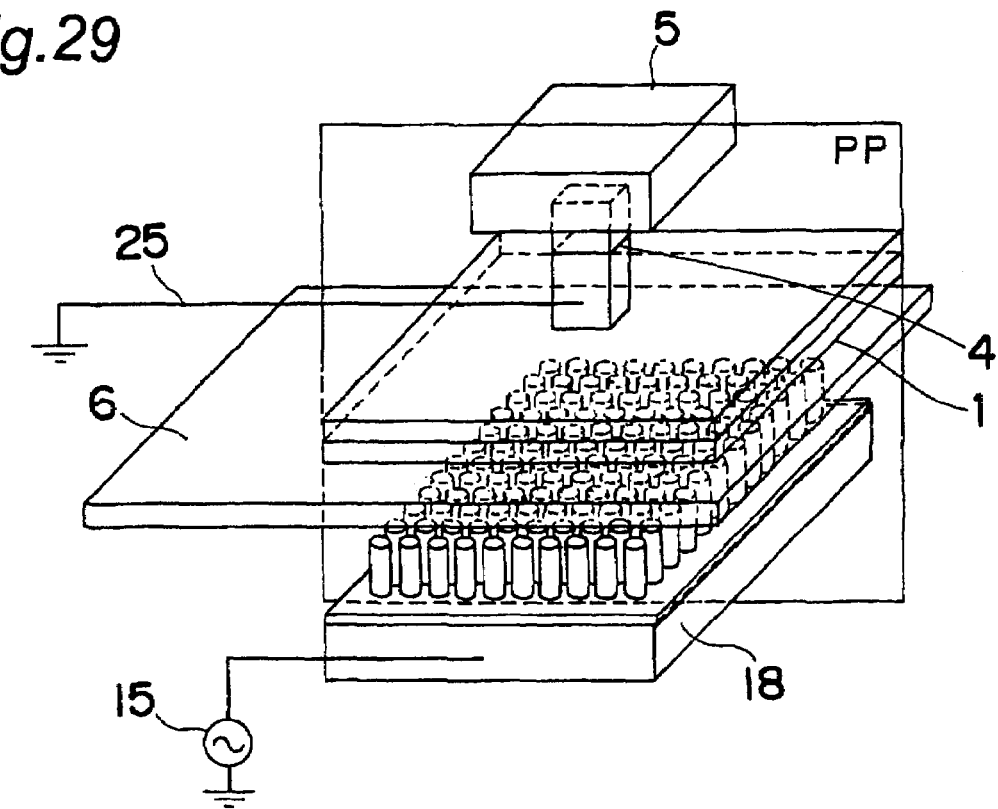
FIG. 29 is a perspective view showing the construction of a plasma processing apparatus employed in a ninth embodiment of the present invention.
Figure 30:
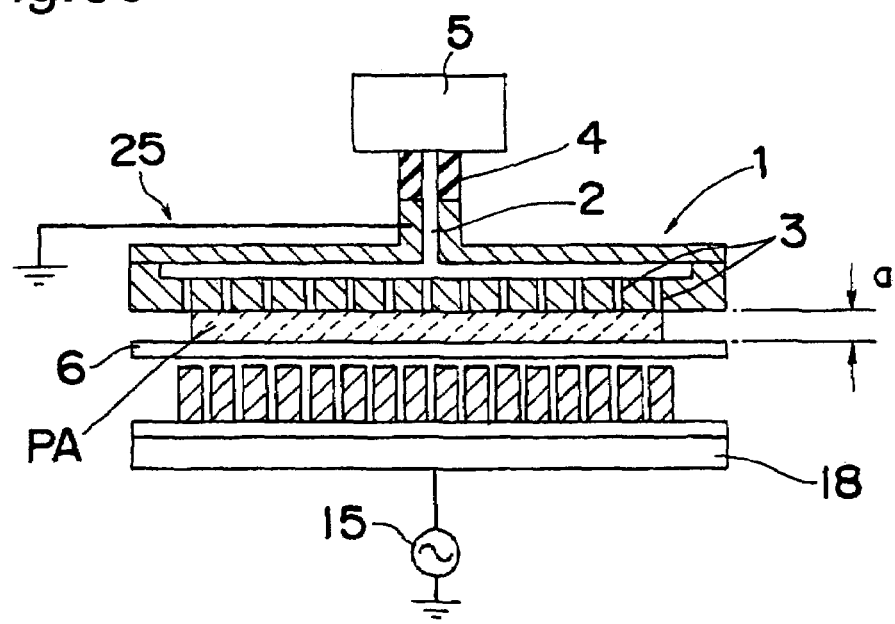
FIG. 30 is a sectional view showing the construction of the plasma processing apparatus employed in the ninth embodiment of the present invention.

FIG. 29 shows a perspective view of a plasma processing apparatus including a plasma source equipped with a flat electrode section 1 employed in the ninth embodiment of the present invention. FIG. 30 shows a sectional view taken along the plane PP of FIG. 29. Referring to FIGS. 29 and 30, a gas passage 2 and gas supply holes 3 are formed in the flat electrode section 1, and gas can be supplied almost perpendicularly to an object 6 to be processed via the gas supply unit 2 and the gas supply holes 3 from a gas supply unit 5 electrically insulated from the flat electrode section 1 by an insulator 4. By arranging an electrode unit 18, which has a plurality of dot-shaped microelectrodes in positions opposite to the plasma source including the flat electrode section 1 potentially controlled as a ground potential via wiring 25 with interposition of the object 6 to be processed and is able to selectively make each dot supply a high-frequency power from a high-frequency power source 15, and supplying a high-frequency power of 13.56 MHz to the electrode unit 18 from the high-frequency power source 15 while supplying the gas from the gas supply unit 5, a plasma of an arbitrary configuration can be generated in a local plasma space PA, and thus, the object 6 to be processed can be processed with the plasma. A distance "a" between the plasma source and the object 6 to be processed is 0.5 mm. It is to be noted that a switching element of a relay or the like is provided in the grounding electrode unit 18, allowing the high-frequency power to be selectively applied.

The plasma source, which is operable from several pascals to several atmospheres, operates typically within a range of 10000 Pa to about three atmospheres. In particular, the operation at and about the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied to the electrode 16, quartz as the object 6 to be processed was etched as plasma processing. Consequently, by selectively supplying the high-frequency power to an arbitrary dot-shaped microelectrode by the electrode unit 18, a plasma of a shape equivalent to an arbitrary dot-like minute shape supplied with the high-frequency power was generated in the local plasma space PA, and thus, etching was able to be effected on the desired pattern.

In the ninth embodiment of the present invention, the plasma source equipped with the flat electrode section 1 enabled the etching to be effected as plasma processing of an arbitrary configuration on the quartz substrate employed as the object 6 to be processed by the electrode unit 18, which had the plurality of dot-shaped microelectrodes in the positions opposite to the plasma source with interposition of the object 6 to be processed and was able to selectively make each dot supply a high-frequency power.

The reason why the size and the position of occurrence of the plasma are changed as described above depending on the size and the positions of the electrodes to which the high frequency is applied will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field was concentrated in the space between the plasma source and the electrode by arranging the plasma source partially potentially controlled in the vicinity of the electrode to which the high frequency was applied, and thus, the plasma was able to be locally generated.

The tenth embodiment of the present invention will be described next with reference to FIGS. 31 and 32.

Figure 31:
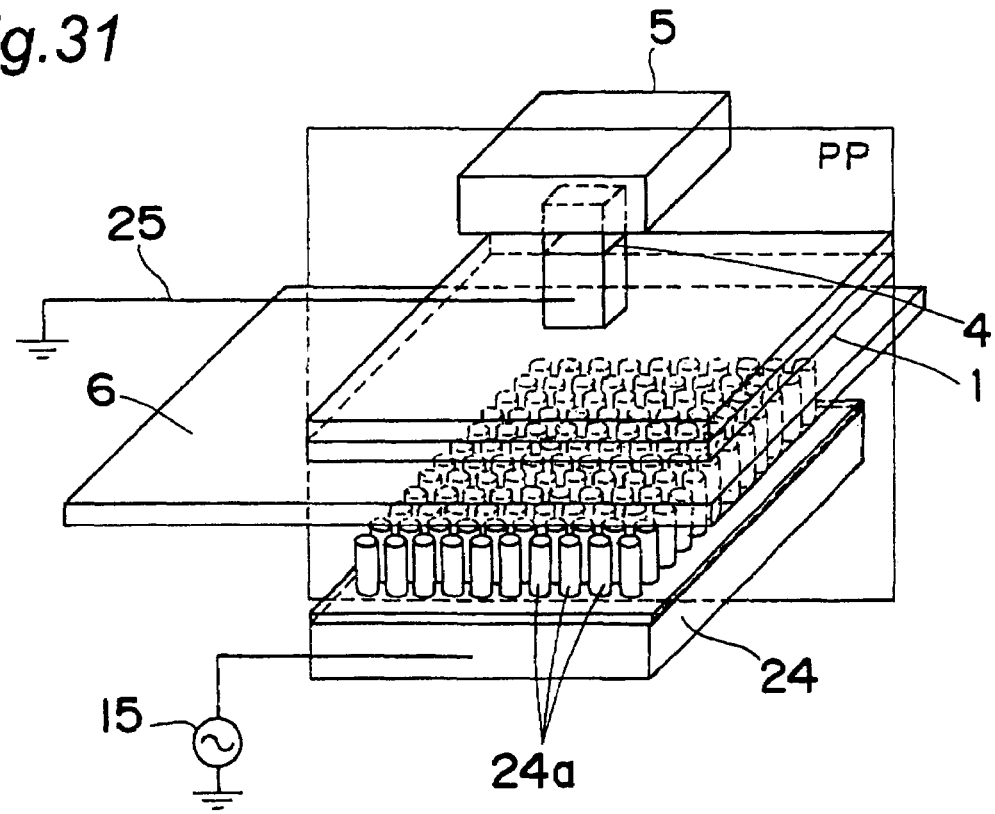
FIG. 31 is a perspective view showing the construction of a plasma processing apparatus employed in a tenth embodiment of the present invention.
Figure 32:
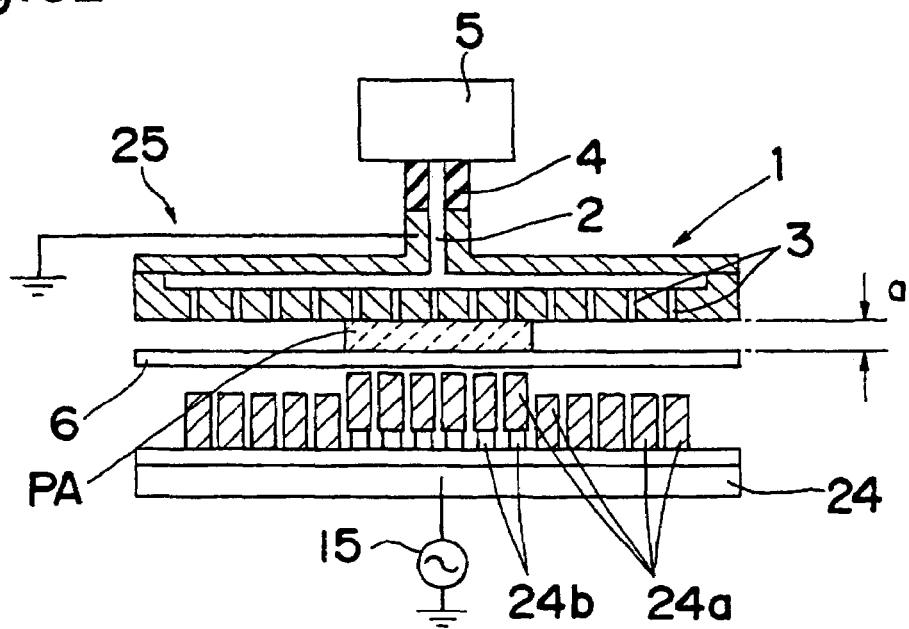
FIG. 32 is a sectional view showing the construction of the plasma processing apparatus employed in the tenth embodiment of the present invention.
Figure 33A:
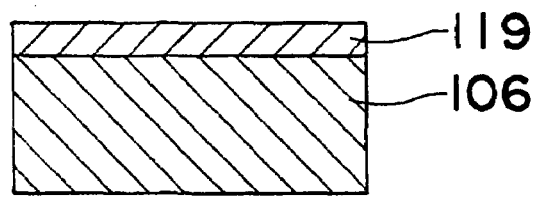
FIGS. 33A, 33B, 33C and 33D are views showing a patterning process used in a prior art example.
Figure 33B:
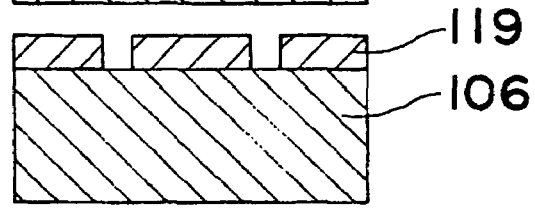
Figure 33C:
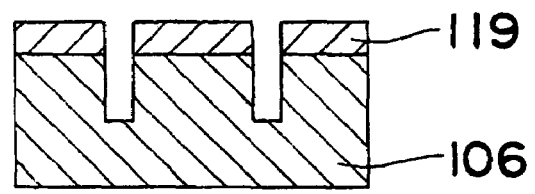
Figure 33D:
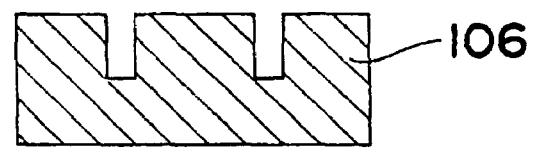
Figure 34:
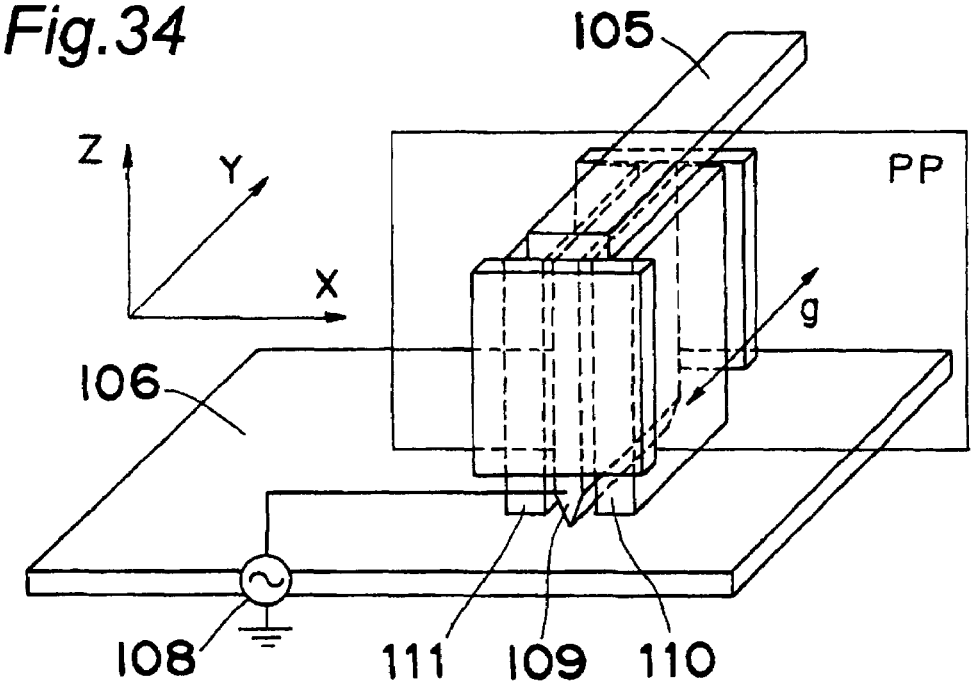
FIG. 34 is a perspective view showing the construction of a plasma processing apparatus employed in a first prior art example.
Figure 35:
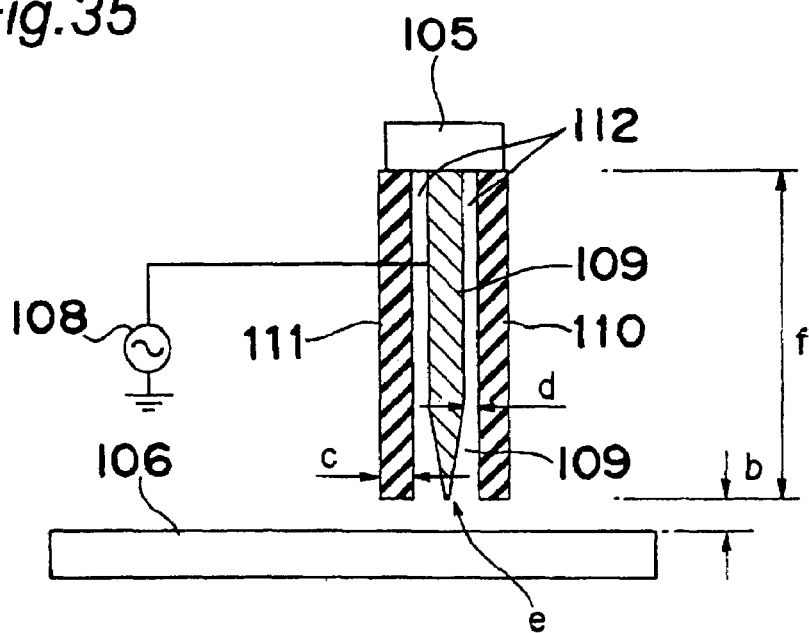
FIG. 35 is a sectional view showing the construction of the plasma processing apparatus employed in the first prior art example.
Figure 36:
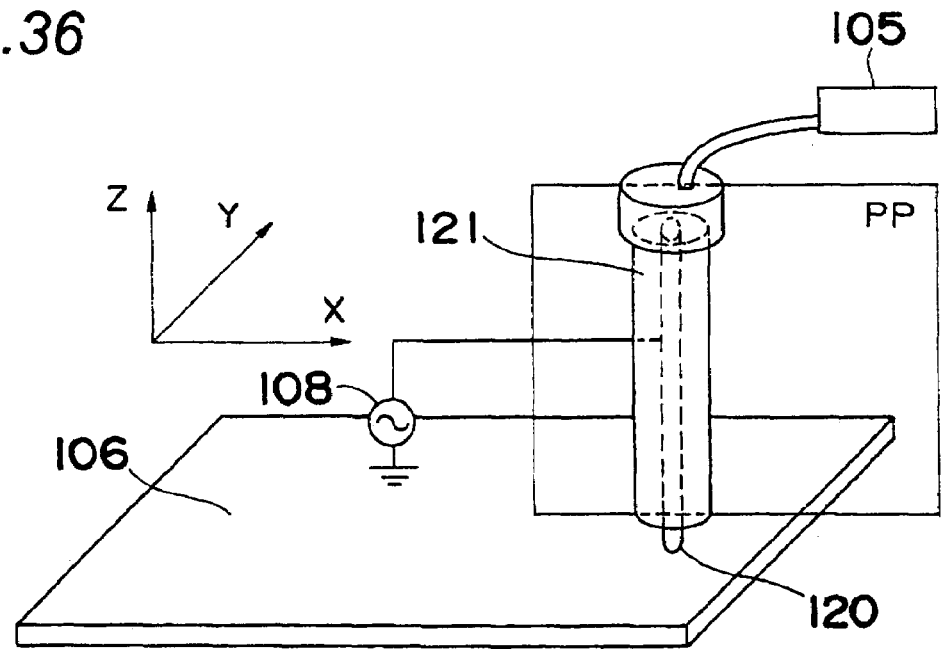
FIG. 36 is a perspective view showing the construction of a plasma processing apparatus employed in a second prior art example.
Figure 37:
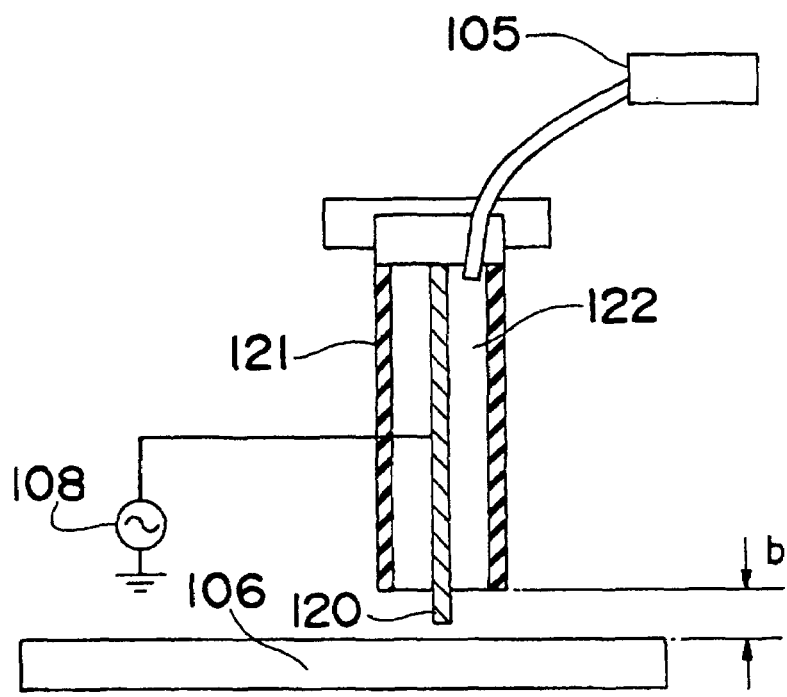
FIG. 37 is a sectional view showing the construction of the plasma processing apparatus employed in the second prior art example.
Figure 38:
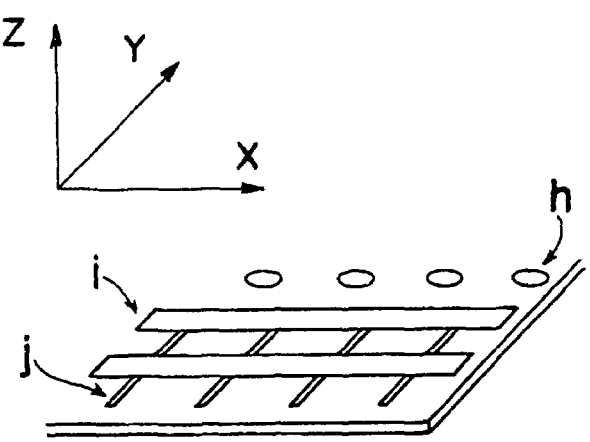
FIG. 38 is a perspective view showing a processing configuration to be effected on an object to be processed.
Figure 39:
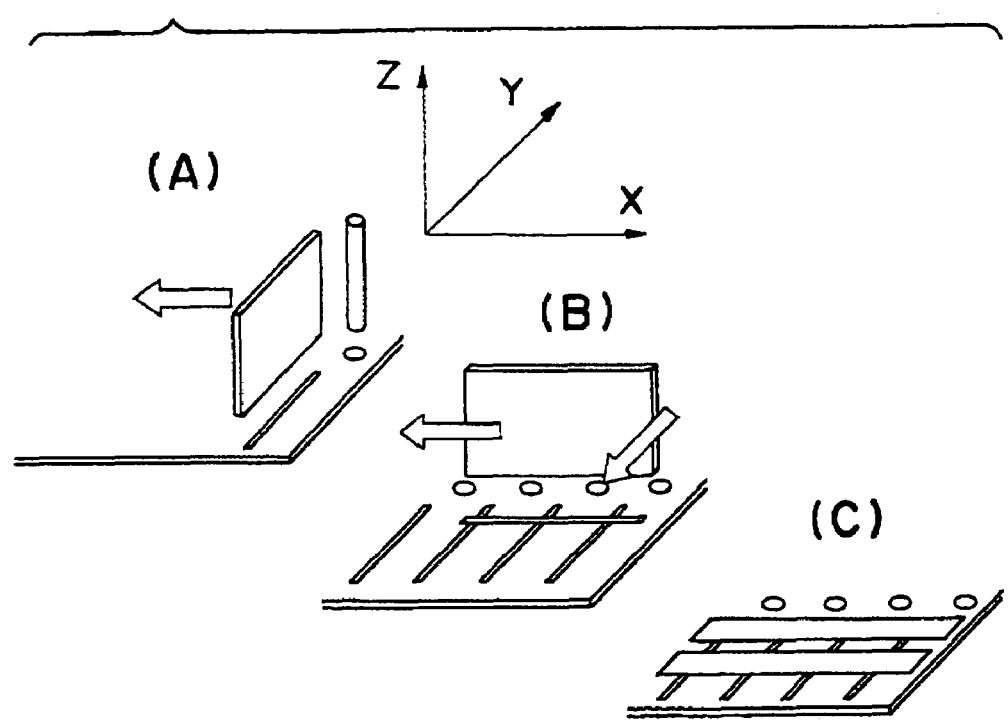
FIG. 39 is a perspective view showing the construction and operation of a plasma processing method and apparatus used in a third prior art example.

FIG. 31 shows a perspective view of a plasma processing apparatus including a plasma source equipped with a flat electrode section 1 employed in the tenth embodiment of the present invention. FIG. 32 shows a sectional view taken along the plane PP of FIG. 31. Referring to FIGS. 31 and 32, a gas passage 2 and gas supply holes 3 are formed in the flat electrode section 1, and gas can be supplied almost perpendicularly to an object 6 to be processed via the gas supply unit 2 and the gas supply holes 3 from a gas supply unit 5 electrically insulated from the flat electrode section 1 by an insulator 4. By arranging an electrode unit 24, which has a plurality of dot-shaped microelectrodes 24*a* in positions opposite to the plasma source including the flat electrode section 1 potentially controlled as a ground potential via wiring 25 with interposition of the object 6 to be processed and is able to supply a high-frequency power from a high-frequency power source 15 to each dot and has moving devices 24*b*, such as air cylinders (as shown in FIG. 44 as one example) or motors, for selectively bringing arbitrary microelectrodes 24*a* close to the object 6 to be processed, and supplying a high-frequency power of 13.56 MHz to the electrode unit 24 from the high-frequency power source 15 while supplying the gas from the gas supply unit 5, a plasma of an arbitrary configuration can be generated in a local plasma space PA, and thus, the object 6 to be processed can be processed with the plasma. A distance "a" between the plasma source and the object 6 to be processed is 0.5 mm.

The plasma source, which is operable from several pascals to several atmospheres, operates typically within a range of 10000 Pa to about three atmospheres. In particular, the operation at and about the atmospheric pressure is especially preferable since neither strict sealed structure nor special exhaust unit is needed and the diffusion of plasma and activated particles is moderately restrained. Under the conditions of He supplied by 1000 sccm and $SF_6$ supplied by 10 sccm as gas and a high-frequency power of 100 W supplied to the electrode 16, quartz as the object 6 to be processed was etched as plasma processing. Consequently, by making the electrode unit 24 that has the moving device supply the high-frequency power to each dot and selectively bringing an arbitrary microelectrode(s) 24a close to the object 6 to be processed, a plasma was generated in the local plasma space PA only in the place where the microelectrode(s) was brought close to the object 6 to be processed, and thus, etching was able to be effected on the desired pattern.

In the tenth embodiment of the present invention, the plasma source equipped with the flat electrode section 1 enables the etching to be effected as plasma processing of an arbitrary configuration on the quartz substrate employed as the object 6 to be processed by the electrode unit 24, which has the plurality of dot-shaped microelectrodes 24a arranged in positions opposite to the plasma source with interposition of the object 6 to be processed and is able to supply a high-frequency power from a high-frequency power source 15 to each dot and has the moving devices 24b for selectively bringing an arbitrary microelectrode(s) 24a close to the object 6 to be processed.

The reason why the size and the position of occurrence of the plasma are changed as described above depending on the size and the positions of the potentially controlled electrodes will be described. It can be considered that the mean free path of the charged particles becomes extremely small when the pressure is increased to the atmospheric pressure level. Accordingly, there are possessed the features that that the discharge starting voltage is raised, the discharge becomes hard to maintain, and the plasma becomes hard to spread. Therefore, it could be considered that an electric field is concentrated in the space between the plasma source and the potentially controlled electrode by arranging the partially potentially controlled electrode in the vicinity of the plasma source to which the high frequency is applied, and thus, the plasma is able to be locally generated.

In connection with the embodiments of the present invention described above, there are described the examples in which the flat plate electrode as the parallel plate type or the knife-edge electrode are employed as the plasma source. However, there can be used various plasma sources of a parallel plate capillary type such as an inductive coupling type, a capillary type of another system, a micro gap system, an inductive coupling tube type, a needle electrode type, and the like.

Moreover, there is exemplified the case of only the ground potential as the plasma source having the potentially controlled electrode, the plasma source that is partially potentially controlled, the electrode having wiring to be potentially controlled, and the plasma source having wiring that is partially potentially controlled. However, the present invention is not limited to the ground potential. For example, it is possible to locally generate plasma by concentrating electric fields between the plasma source and the electrode in various potential control systems of, for example, a dc power, a pulse dc power, a pulse ac power, and an ac power. Furthermore, a similar effect can be obtained when the flat electrode section serving as one example of the first electrode is made to have a floating potential and the grounding electrode serving as one example of the second electrode is potentially controlled to a potential other than the ground potential.

Moreover, it is also possible to improve the processing speed or film forming rate with strengthened action to draw in ions in the plasma by supplying a dc voltage, a pulse dc voltage or a pulse ac voltage to a metal portion or a semiconductor portion on the object to be processed.

Moreover, there is exemplified the case of only the plasma processing constructed mainly of the He gas as gas. However, the gas is not limited to this, and the plasma processing can be achieved with various gases of gas constituted mainly of inert gas such as Ar gas, Ne gas, and Xe gas; or reactive gas of a gas of CxFy (x and y are natural numbers) such as $CF_4$, $NF_3$ gas, $O_2$ gas, $Cl_1$, gas, or halogen-containing gas such as HBr.

Moreover, there are exemplified only etching as plasma processing. However, the plasma processing is not limited to this but applicable to various plasma processes such as plasma cleaning, CVD, sputtering, and plasma doping.

Moreover, there are exemplified the case of quartz processed with a plasma as the object to be processed. However, the object to be processed is limited none of them, and the present invention is applicable to the plasma processing of various thin films and substrates including metal films such a semiconductor film of Si or the like, metal films of Mo, Al, or the like; or to the plasma processing of objects to be processed coated with various films. It is possible to carry out an etching process of resins or the like, represented by photoresist and polyimide using a mixed gas of He and $O_2$. Moreover, it is also possible to continuously effect plasma processing while conveying a sheet-shaped object to be processed in a roll-to-roll system. Otherwise, it is possible to carry out thin film deposition on the surfaces of various objects to be processed by the plasma CVD method.

Moreover, there is exemplified the case of plasma generated by using a high-frequency power of 13.56 MHz, it is possible to generate plasma by using a high-frequency power of a frequency ranging from several hundreds kilohertz to several gigahertz. Otherwise, it is also possible to generate a highly efficient plasma while restraining the transition to arc discharge by supplying a pulse power.

Moreover, there is exemplified the fact that the distance between the plasma source and the object to be processed is 0.5 mm. However, ignition of a plasma is comparatively easy and a plasma is easily generated when the distance is within a range of 0.01 mm to 3 mm.

Furthermore, it is easy to process a fine line by plasma processing when the distance between the plasma source and the object to be processed is within a range of 0.05 mm to 0.5 mm.

Moreover, there is exemplified only the case of the plurality of second electrodes arranged. However, it is possible to generate a plasma concurrently in a plurality of places when a plurality of plasma sources are arranged or when a plurality of plasma sources and a plurality of second electrodes are arranged, and a similar effect can be obtained.

Moreover, there is exemplified the case of the relative displacement of the positions of the plasma source and the potentially controlled electrode in the direction parallel to the substrate. However, since in order to avoid to occur a case where a matching unit can not follow the change of the plasma impedance when the movement velocity becomes excessively large, and thus the plasma is broken, it is proper to set the movement velocity of plasma at a speed of not higher than 300 mm/s.

As is apparent from the above description, according to the plasma processing method of the present invention, there is provided the plasma processing method for supplying the electric power to the plasma source arranged in the vicinity of the object to be processed while supplying the gas at a pressure in the vicinity of the atmospheric pressure. By arranging the potentially controlled electrode in the position opposite to the plasma source via the object to be processed and processing a part of the object to be processed, the object can be processed in the desired arbitrary configuration with a plasma by a simple plasma source without using a mask such as a resist.

Moreover, according to the plasma processing method of the present invention, there is provided the plasma processing method for supplying the electric power to the plasma source arranged in the vicinity of the object to be processed while supplying the gas at a pressure in the vicinity of the atmospheric pressure. By making the surface of the plasma source opposite to the object to be processed have a rectangular or linear shape, arranging the potentially controlled electrode in the position opposite to the plasma source via the object to be processed and processing a part of the object to be processed, the object can be processed in the linear shape of the desired length with a plasma by a simple plasma source without using a mask such as a resist.

Moreover, according to the plasma processing method of the present invention, there is provided the plasma processing method for supplying the electric power to the plasma source arranged in the vicinity of the object to be processed while supplying the gas at a pressure in the vicinity of the atmospheric pressure. By arranging the potentially controlled electrode in the position opposite to the plasma source via the object to be processed, the object can be processed in the desired arbitrary configuration with a plasma by a simple plasma source without using a mask such as a resist, and the object can be processed in the arbitrary configuration with a plasma over a wide range without scanning the plasma source or the electrode.

Moreover, according to the plasma processing method of the present invention, there is provided the plasma processing method for supplying the electric power to the plasma source arranged in the vicinity of the object to be processed while supplying the gas at a pressure in the vicinity of the atmospheric pressure. By arranging the electrode, which is constructed of the dot-shaped microelectrodes in the position opposite to the plasma source with interposition of the object to be processed and is potentially controlled and selectively potentially controlling the microelectrode(s), the object can be processed in the desired arbitrary configuration with a plasma by a simple plasma source without using a mask such as a resist, and the object can be processed in several kinds of configurations with a plasma over a wide range by one electrode without scanning the plasma source or the electrode.

Moreover, according to the plasma processing method of the present invention, there is provided the plasma processing method for supplying the electric power to the plasma source arranged in the vicinity of the object to be processed while supplying the gas at a pressure in the vicinity of the atmospheric pressure. By arranging the electrode, which is constructed of the plurality of dot-shaped microelectrodes in the position opposite to the plasma source via the object to be processed and is potentially controlled and selectively bringing an arbitrary microelectrode(s) close to the object to be processed, the object can be processed in the desired arbitrary configuration with a plasma by a simple plasma source without using a mask such as a resist, and the object can be processed in several kinds of configurations with a plasma over a wide range by one electrode without scanning the plasma source or the electrode.

According to the plasma processing method of the present invention, there is provided the plasma processing method for potentially controlling a part of the plasma source while supplying the gas to the plasma source arranged in the vicinity of the object to be processed at a pressure in the vicinity of the atmospheric pressure. By arranging the electrode to which the electric power is applied in the position opposite to the plasma source via the object to be processed, the object can be processed in the desired arbitrary configuration with a plasma by a simple plasma source without using a mask such as a resist, and high-speed plasma processing can be achieved since the action of drawing in the ions in the plasma is strengthened.

According to the plasma processing method of the present invention, by potentially controlling a part of the plasma source while supplying the gas to the plasma source arranged in the vicinity of the object to be processed at a pressure in the vicinity of the atmospheric pressure, making the opposite surface of the plasma source to the object to be processed have a rectangular or linear shape, and arranging the electrode to which the electric power is applied in the position opposite to the plasma source via the object to be processed, the object can be processed in the linear shape of the desired length with a plasma by a simple plasma source without using a mask such as a resist, and high-speed plasma processing can be achieved since the action of drawing in the ions in the plasma is strengthened.

According to the plasma processing method of the present invention, there is provided the plasma processing method for potentially controlling a part of the plasma source while supplying the gas to the plasma source arranged in the vicinity of the object to be processed at a pressure in the vicinity of the atmospheric pressure. By arranging the electrode, of which the surface opposite to the object to be processed has an arbitrary configuration and to which the electric power is applied, in the position opposite to the plasma source via the object to be processed, the object can be processed in the desired arbitrary configuration with a plasma by a simple plasma source without using a mask such as a resist, and the object can be processed in an arbitrary configuration with a plasma over a wide range without scanning the plasma source or the electrode. High-speed plasma processing can be achieved since the action-of drawing in the ions in the plasma is strengthened.

According to the plasma processing method of the present invention, there is provided the plasma processing method for potentially controlling a part of the plasma source while supplying the gas to the plasma source arranged in the vicinity of the object to be processed at a pressure in the vicinity of the atmospheric pressure. By providing the electrode constructed of the plurality of dot-shaped microelectrodes in the position opposite to the plasma source via the object to be processed and selectively applying the electric power to each of the microelectrodes, the object can be processed in the desired arbitrary configuration with a plasma by a simple plasma source without using a mask such as a resist, and the object can be processed in several kinds of configurations with a plasma by one electrode over a wide range without scanning the plasma source or the electrode. High-speed plasma processing can be achieved since the action of drawing in the ions in the plasma is strengthened.

According to the plasma processing method of the present invention, there is provided the plasma processing method for potentially controlling a part of the plasma source while supplying the gas to the plasma source arranged in the vicinity of the object to be processed at a pressure in the vicinity of the atmospheric pressure. By providing the electrode constructed of the plurality of dot-shaped microelectrodes in the position opposite to the plasma source via the object to be processed, applying the electric power to each of the microelectrodes and selectively bringing an arbitrary microelectrode(s) close to the object to be processed, the object can be processed in the desired arbitrary configuration with a plasma by a simple plasma source without using a mask such as a resist, and can be processed in several kinds of configurations with a plasma by one electrode over a wide range without scanning the plasma source or the electrode. High-speed plasma processing can be achieved since the action of drawing in the ions in the plasma is strengthened.

According to the plasma processing apparatus of the present invention, there is provided the plasma processing apparatus that has the plasma source, the gas supply unit, and the power supply unit. By providing the electrode that has the wiring to be potentially controlled in the position opposite to the plasma source via the position where the object to be processed is to be arranged, the object can be processed in the desired arbitrary configuration with a plasma by a simple plasma source without using a mask such as a resist.

According to the plasma processing apparatus of the present invention, there is provided the plasma processing apparatus that has the plasma source, the gas supply unit, and the power supply unit. By making the surface of the plasma source opposite to the object to be processed have a rectangular or linear shape and providing the electrode that has the wiring to be potentially controlled in the position opposite to the plasma source via the position where the object to be processed is to be arranged, the object can be processed in the linear shape of the desired length with a plasma by a simple plasma source without using a mask such as a resist.

According to the plasma processing apparatus of the present invention, there is provided the plasma processing apparatus that has the plasma source, the gas supply unit, and the power supply unit. By providing the electrode, of which the surface opposite to the object to be processed has a configuration nearly identical to an arbitrary configuration of plasma processing to be effected on the object to be processed and which has the wiring to be potentially controlled, in the position opposite to the plasma source via the position where the object to be processed is to be arranged, the object can be processed in the desired arbitrary configuration with a plasma by a simple plasma source without using a mask such as a resist, and the object can be processed in the arbitrary configuration with a plasma over a wide range without scanning the plasma source or the electrode.

According to the plasma processing apparatus of the present invention, there is provided the plasma processing apparatus that has the plasma source, the gas supply unit, and the power supply unit. By providing the electrode unit, which is constructed of the plurality of dot-shaped microelectrodes and is able to selectively potentially control the plurality of microelectrodes with the wiring to be potentially controlled, in the position opposite to the plasma source via the position where the object to be processed is to be arranged, the object can be processed in the desired arbitrary configuration with a plasma by a simple plasma source without using a mask such as a resist, and the object can be processed in several kinds of configurations with a plasma by one electrode over a wide range without scanning the plasma source or the electrode.

According to the plasma processing apparatus of the present invention, there is provided the plasma processing apparatus that has the plasma source, the gas supply unit, and the power supply unit. By providing the electrode unit, which is constructed of the plurality of dot-shaped microelectrodes and is able to selectively bring an arbitrary microelectrode(s) close to the object to be processed with the wiring to be potentially controlled, in the position opposite to the plasma source via the position where the object to be processed is to be arranged, the object can be processed in the desired arbitrary configuration with a plasma by a simple plasma source without using a mask such as a resist, and the object can be processed in several kinds of configurations with a plasma by one electrode over a wide range without scanning the plasma source or the electrode.

According to the plasma processing apparatus of the present invention, there is provided the plasma processing apparatus that has the plasma source, the gas supply unit, and the wiring for potentially controlling a part of the plasma source. By providing the electrode unit, which has the power supply unit for supplying the electric power to the position opposite to the plasma source via the position where the object to be processed is to be arranged, the object can be processed in the desired arbitrary configuration with a plasma by a simple plasma source without using a mask such as a resist, and high-speed plasma processing can be achieved since the action of drawing in the ions in the plasma is strengthened.

According to the plasma processing apparatus of the present invention, there is provided the plasma processing apparatus that has the plasma source, the gas supply unit, and the wiring for potentially controlling a part of the plasma source. By making the surface of the plasma source opposite to the object to be processed have a rectangular or linear shape and providing the electrode unit, which has the power supply unit for supplying the electric power to the position opposite to the plasma source via the position where the object to be processed is to be arranged, the object can be processed in a linear shape of the desired length with a plasma by a simple plasma source without using a mask such as a resist, and high-speed plasma processing can be achieved since the action of drawing in the ions in the plasma is strengthened.

According to the plasma processing apparatus of the present invention, there is provided the plasma processing apparatus that has the plasma source, the gas supply unit, and the wiring for potentially controlling a part of the plasma source. By providing the electrode, of which the surface opposite to the object to be processed has a shape nearly identical to an arbitrary configuration of plasma processing to be effected on the object to be processed and has the electrode having the power supply unit for supplying the electric power, in the position opposite to the plasma source via the position where the object to be processed is to be arranged, the object can be processed in the desired arbitrary configuration with a plasma by a simple plasma source without using a mask such as a resist, and the object can be processed in an arbitrary configuration with a plasma over a wide range without scanning the plasma source or the electrode. High-speed plasma processing can be achieved since the action of drawing in the ions in the plasma is strengthened.

According to the plasma processing apparatus of the present invention, there is provided the plasma processing apparatus that has the plasma source, the gas supply unit, and the wiring for potentially controlling a part of the plasma source. By providing the electrode unit, which is constructed of the plurality of dot-shaped microelectrodes and has the electric power supply unit capable of selectively applying the electric power to each of the plurality of microelectrodes, in the position opposite to the plasma source via the position where the object to be processed is to be arranged, the object can be processed in the desired arbitrary configuration with a plasma by a simple plasma source without using a mask such as a resist, and the object can be processed in several kinds of configurations with a plasma by one electrode over a wide range without scanning the plasma source or the electrode. High-speed plasma processing can be achieved since the action of drawing in the ions in the plasma is strengthened.

According to the plasma processing apparatus of the present invention, there is provided the plasma processing apparatus that has the plasma source, the gas supply unit, and the wiring for potentially controlling a part of the plasma source. By providing the electrode unit, which is constructed of the plurality of dot-shaped microelectrodes and able to apply the electric power to is each of the microelectrodes and selectively brings an arbitrary microelectrode(s) close to the object to be processed, in the position opposite to the plasma source via the position where the object to be processed is to be arranged, the object can be processed in the desired arbitrary configuration with a plasma by a simple plasma source without using a mask such as a resist, and the object can be processed in several kinds of configurations with a plasma by one electrode over a wide range without scanning the plasma source or the electrode. High-speed plasma processing can be achieved since the action of

What is claimed is:

1. A plasma processing method comprising:
supplying electric power to a high frequency electrode;
making another electrode have a ground potential while supplying gas to a plasma source for processing an object to be processed at a pressure in a range of 10000 Pa to approximately three atmospheres;
processing a part of the object to be processed with a plasma, while supplying electric power to the high frequency electrode, wherein an area defined by an entire surface of the high frequency or the grounded electrode, which is arranged in a position opposite to the plasma source via the object to be processed, is smaller than an area defined by the perimeter of a surface of the plasma source superposed on the object to be processed, and the longest linear dimension of the surface of the high frequency or grounded electrode, which is arranged in the position opposite to the plasma source via the object to be processed, is shorter than the longest linear dimension within the area defined by the perimeter of the surface of the plasma source that is superposed on the object to be processed such that the area of the high frequency or grounded electrode that opposes the plasma source is smaller than the area defined by the perimeter of the surface of the plasma source that is superposed on the object,
wherein the high frequency or grounded electrode, which is arranged in the position opposite to the plasma source via the object to be processed, includes a plurality of electrodes which are movable relative to the object to be processed; and
moving the high frequency or grounded electrode, which is arranged in the position opposite to the plasma source via the object to be processed, toward or away from the object and controlling the electric potential of less than all of the plurality of electrodes to generate plasma on the object in a desired configuration.

2. The plasma processing method as claimed in claim 1, wherein each of the plurality of electrodes are independently controlled to permit less than all of the plurality of electrodes to be moved toward the object.

3. The plasma processing method as claimed in claim 1, wherein the object to be processed is processed with a plasma into the desired configuration by selectively bringing arbitrary ones of the plurality of electrodes within a range of 0.05 mm to 0.5 mm from the object to be processed.

4. The plasma processing method as claimed in claim 1, wherein the object to be processed has a substrate or a thin film of a volume resistivity of not smaller than $10^{-6}$ ($\Omega$-cm).

5. The plasma processing method as claimed in claim 1, wherein the object to be processed has a substrate or a thin film of a volume resistivity of not smaller than $10^8$ ($\Omega$-cm).

6. The plasma processing method as claimed in claim 1, wherein positions of the plasma source and the high frequency electrode are displaced relative to the object to be processed.

7. The plasma processing method as claimed in claim 1, wherein the gas includes at least any one of inert gases of He, Ar, Ne, and Xe.

8. The plasma processing method as claimed in claim 1, wherein the gas includes a gas selected from the group consisting of CxFy (x and y are natural numbers), $SF_6$, $NF_3$, $O_2$, $Cl_2$, and a halogen containing gas.

9. A plasma processing method comprising:
providing an object to be processed between a plasma source and a second electrode, wherein the plasma source includes a first electrode and the second electrode is potentially controlled in a position opposite to the plasma source, wherein the second electrode includes a plurality of electrodes which are movable relative to the object to be processed; and
supplying a high-frequency electric power to the first electrode while supplying gas from a gas supply unit to the object to be processed at a pressure in a range of 10000 Pa to approximately three atmospheres to generate plasma on a part of the object to be processed,
wherein the longest dimension of the area defined by the surface of the potentially controlled second electrode that is superposed on the object to be processed is smaller than the shortest dimension of an area defined by the perimeter of the opposing side of the object, and
the plasma is generated in a desired configuration by controlling the electric potential of less than all of the plurality of electrodes.

10. The plasma processing method as claimed in claim 9, wherein the electric potential of each of the plurality of electrodes can be independently and selectively controlled, and the object to be processed is processed by potentially controlling selected ones of the plurality of electrodes.

11. The plasma processing method as claimed in claim 9, wherein each of the plurality of electrodes are independently and selectively controlled, and the object to be processed is processed by selectively bringing arbitrary ones of the potentially controlled electrodes within a range of 0.05 mm to 0.5 mm from the object to be processed.

12. The plasma processing method as claimed in claim 9, wherein the object to be processed has a substrate or a thin film of a volume resistivity of not smaller than $10^{-6}$ ($\Omega$-cm).

13. The plasma processing method as claimed in claim 9, wherein the object to be processed has a substrate or a thin film of a volume resistivity of not smaller than $10^8$ ($\Omega$-cm).

14. The plasma processing method as claimed in claim 9, wherein positions of the plasma source and the potentially controlled second electrode can be displaced relative to the object to be processed.

15. The plasma processing method as claimed in claim 9, wherein the gas includes at least any one of inert gases of He, Ar, Ne, and Xe.

16. The plasma processing method as claimed in claim 9, wherein the gas includes a gas selected from the group consisting of $CxFy$ (x and y are natural numbers), $SF_6$, $NF_3$, $O_2$, $Cl_2$, or a halogen containing gas.

* * * * *